United States Patent
Lee et al.

(10) Patent No.: US 9,799,621 B2
(45) Date of Patent: Oct. 24, 2017

(54) SEMICONDUCTOR DEVICE AND METHOD OF FORMING DUPLEX PLATED BUMP-ON-LEAD PAD OVER SUBSTRATE FOR FINER PITCH BETWEEN ADJACENT TRACES

(71) Applicant: STATS ChipPAC, Ltd., Singapore (SG)

(72) Inventors: Soo Won Lee, Gyoung Ki-Do (KR); Kyu Won Lee, Kyunggi-Do (KR); Eun Jin Jeong, Chungbuk (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/334,229

(22) Filed: Jul. 17, 2014

(65) Prior Publication Data

US 2014/0327135 A1    Nov. 6, 2014

Related U.S. Application Data

(63) Continuation of application No. 13/424,710, filed on Mar. 20, 2012, now abandoned.

(51) Int. Cl.
*H01L 23/00*    (2006.01)
*H01L 23/498*    (2006.01)
*H01L 21/48*    (2006.01)

(52) U.S. Cl.
CPC .......... *H01L 24/13* (2013.01); *H01L 21/4846* (2013.01); *H01L 23/498* (2013.01);
(Continued)

(58) Field of Classification Search
CPC ......... H01L 24/11; H01L 24/13; H01L 24/16;
H01L 24/81; H01L 21/4846; H01L 23/498; H01L 23/49838; H01L 2924/00014; H01L 2924/01322; H01L 2924/12041; H01L 2924/12042; H01L 2924/1306; H01L 2924/13091; H01L 2924/15311; H01L 2924/181; H01L 2224/0345; H01L 2224/03452; H01L 2224/0346;
(Continued)

(56) References Cited

U.S. PATENT DOCUMENTS 6,111,204 A    8/2000    Goenka
6,191,494 B1    2/2001    Ooyama et al.
(Continued)

*Primary Examiner* — Lex Malsawma
*Assistant Examiner* — Gardner W Swan
(74) *Attorney, Agent, or Firm* — Robert D. Atkins; Atkins and Associates, P.C.

(57) ABSTRACT

A semiconductor device has a substrate. A conductive layer is formed over the substrate. A duplex plated bump on lead pad is formed over the substrate. An insulating layer is formed over the conductive layer and the substrate. A portion of the insulating over the duplex plated bump on lead pad is removed using a laser direct ablation process. The insulating layer is a lamination layer. The duplex plated bump on lead pad has a wide bump on lead pad. A semiconductor die is mounted over the substrate. The semiconductor die has a composite conductive interconnect structure. The semiconductor die has a first bump and a second bump with a pitch ranging from 90-150 micrometers between the first bump and the second bump. A duplex plated contact pad is formed on a surface of the substrate opposite the duplex plated bump-on-lead pad.

10 Claims, 29 Drawing Sheets

(52) U.S. Cl.
CPC ........ *H01L 23/49838* (2013.01); *H01L 24/11* (2013.01); *H01L 24/81* (2013.01); *H01L 24/16* (2013.01); *H01L 2224/0345* (2013.01); *H01L 2224/0346* (2013.01); *H01L 2224/0347* (2013.01); *H01L 2224/03452* (2013.01); *H01L 2224/0401* (2013.01); *H01L 2224/0508* (2013.01); *H01L 2224/05027* (2013.01); *H01L 2224/05155* (2013.01); *H01L 2224/05164* (2013.01); *H01L 2224/05166* (2013.01); *H01L 2224/05169* (2013.01); *H01L 2224/05171* (2013.01); *H01L 2224/05172* (2013.01); *H01L 2224/05181* (2013.01); *H01L 2224/05552* (2013.01); *H01L 2224/05554* (2013.01); *H01L 2224/05572* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05671* (2013.01); *H01L 2224/1132* (2013.01); *H01L 2224/1145* (2013.01); *H01L 2224/1146* (2013.01); *H01L 2224/1147* (2013.01); *H01L 2224/131* (2013.01); *H01L 2224/13082* (2013.01); *H01L 2224/13111* (2013.01); *H01L 2224/13113* (2013.01); *H01L 2224/13124* (2013.01); *H01L 2224/13144* (2013.01); *H01L 2224/13147* (2013.01); *H01L 2224/13184* (2013.01); *H01L 2224/16237* (2013.01); *H01L 2224/16238* (2013.01); *H01L 2224/48091* (2013.01); *H01L 2224/73265* (2013.01); *H01L 2224/81191* (2013.01); *H01L 2224/81203* (2013.01); *H01L 2224/81385* (2013.01); *H01L 2224/81815* (2013.01); *H01L 2224/94* (2013.01); *H01L 2924/00014* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01)

(58) Field of Classification Search
CPC ..... H01L 2224/0347; H01L 2224/0401; H01L 2224/05027; H01L 2224/0508; H01L 2224/05155; H01L 2224/05164; H01L 2224/05166; H01L 2224/05169; H01L 2224/05171; H01L 2224/05172; H01L 2224/05181; H01L 2224/05552; H01L 2224/05554; H01L 2224/05572; H01L 2224/05611; H01L 2224/05624; H01L 2224/05639; H01L 2224/05644; H01L 2224/05647; H01L 2224/05655; H01L 2224/05666; H01L 2224/05671; H01L 2224/1132; H01L 2224/1145–2224/1147; H01L 2224/1308

See application file for complete search history.

(56) References Cited

U.S. PATENT DOCUMENTS

| | | | |
|---|---|---|---|
| 6,362,087 B1* | 3/2002 | Wang | H01L 23/3114 257/685 |
| 6,740,577 B2 | 5/2004 | Jin et al. | |
| 7,081,403 B1 | 7/2006 | Kirloskar et al. | |
| 7,705,471 B2 | 4/2010 | Hu | |
| 7,847,400 B2 | 12/2010 | Hu | |
| 7,956,472 B2* | 6/2011 | Hsu | H01L 21/4853 257/753 |
| 7,964,450 B2 | 6/2011 | Camacho et al. | |
| 8,053,277 B2 | 11/2011 | Yu et al. | |
| 2003/0092219 A1* | 5/2003 | Ohuchi | H01L 21/78 438/110 |
| 2003/0122246 A1* | 7/2003 | Lin | H01L 23/36 257/723 |
| 2003/0197283 A1* | 10/2003 | Choi | H01L 23/5387 257/777 |
| 2005/0158009 A1 | 7/2005 | Eichelberger | |
| 2006/0166406 A1* | 7/2006 | Lin | H01L 21/4832 438/110 |
| 2006/0244140 A1* | 11/2006 | Hu | H01L 21/4853 257/737 |
| 2007/0108605 A1 | 5/2007 | Yoon et al. | |
| 2007/0158847 A1 | 7/2007 | Hsu | |
| 2008/0169548 A1 | 7/2008 | Baek | |
| 2008/0272501 A1* | 11/2008 | Hu | H01L 23/498 257/782 |
| 2009/0071699 A1 | 3/2009 | Hsu | |
| 2009/0224409 A1* | 9/2009 | Miyata | H01L 21/78 257/774 |
| 2009/0289364 A1* | 11/2009 | Sakamoto | H01L 23/3114 257/738 |
| 2010/0081236 A1 | 4/2010 | Yang et al. | |
| 2011/0045634 A1* | 2/2011 | Pagaila | H01L 24/19 438/107 |
| 2011/0204512 A1 | 8/2011 | Camacho et al. | |
| 2012/0043672 A1 | 2/2012 | Cho et al. | |
| 2012/0052677 A1 | 3/2012 | Zenner et al. | |
| 2012/0067635 A1 | 3/2012 | Nang et al. | |
| 2012/0119379 A1* | 5/2012 | Koizumi | H01L 23/5389 257/774 |
| 2012/0248075 A1 | 10/2012 | Alpay et al. | |
| 2013/0017681 A1 | 1/2013 | Willeke et al. | |

* cited by examiner

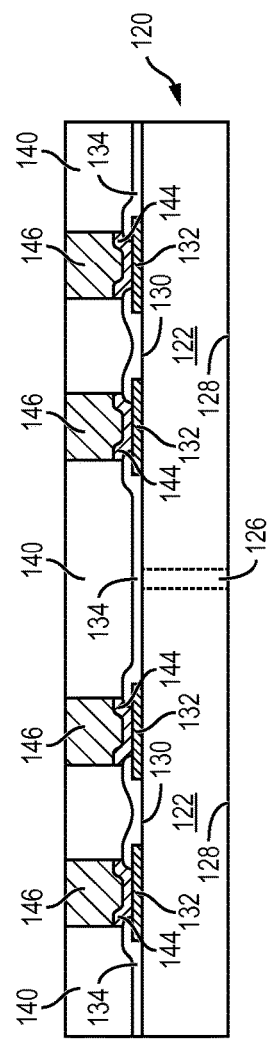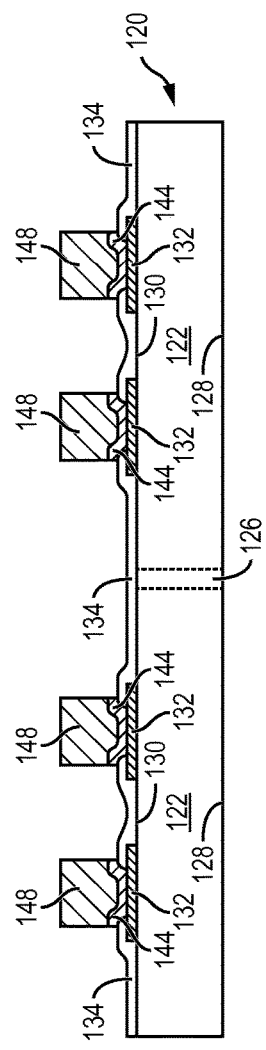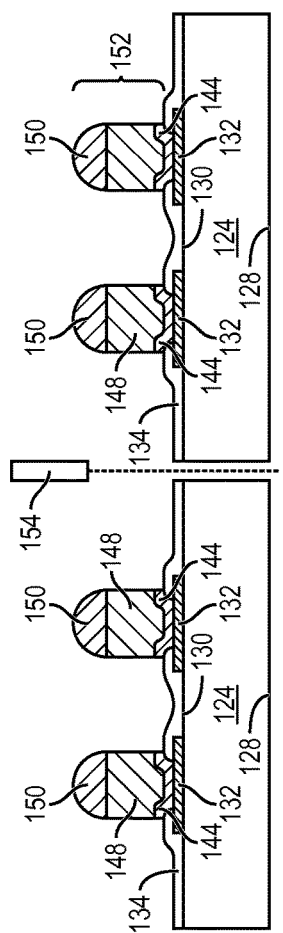

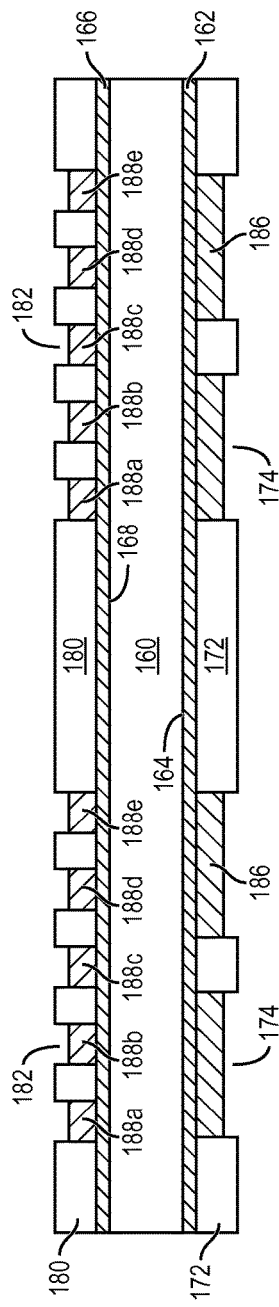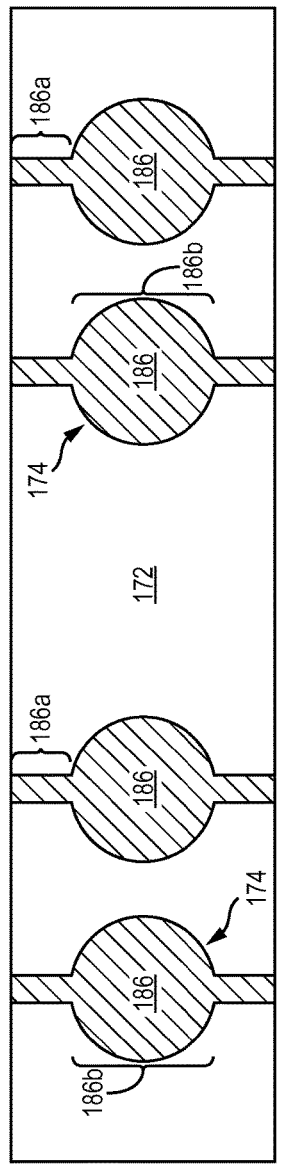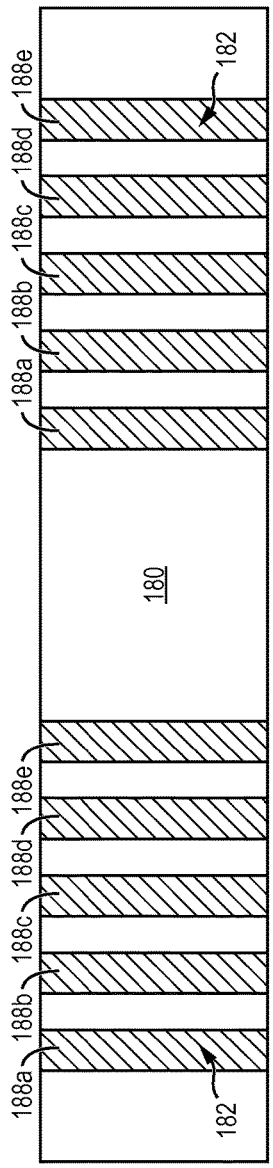
FIG. 4g
FIG. 4h
FIG. 4i

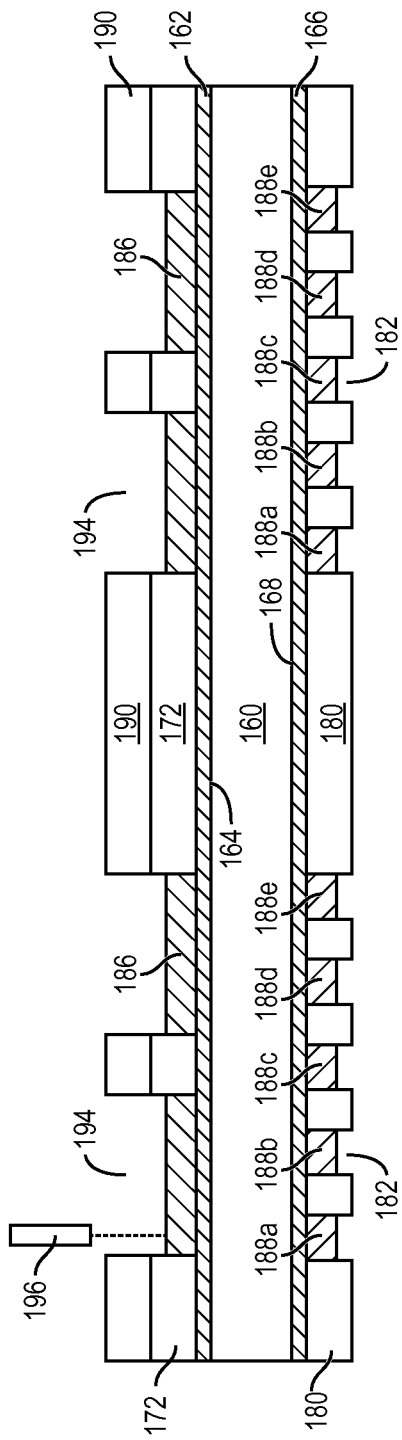
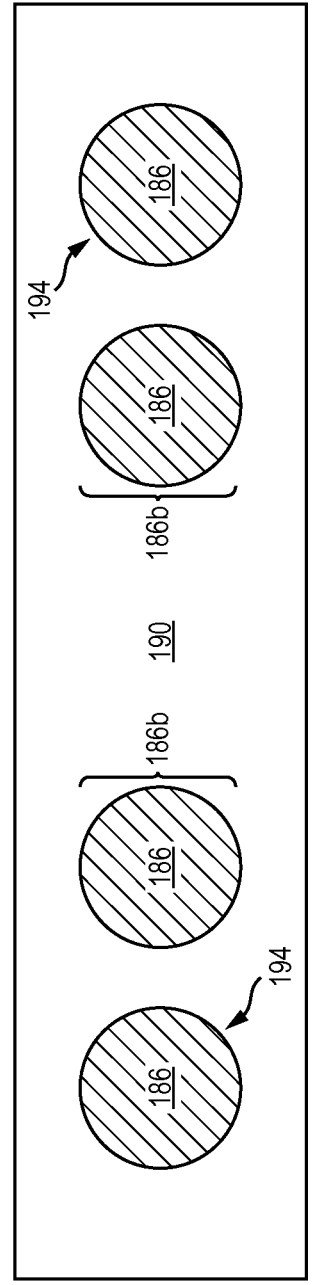
FIG. 4j
FIG. 4k

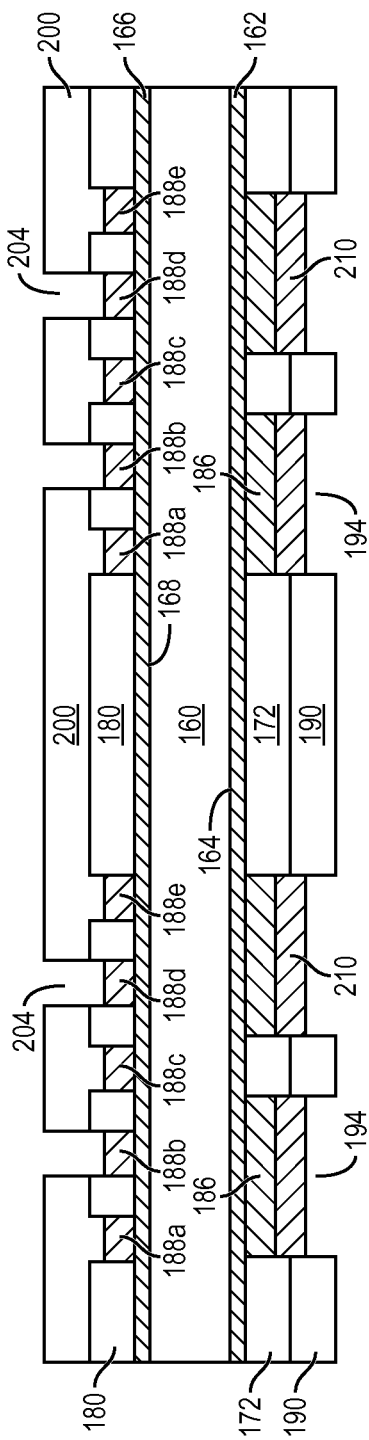
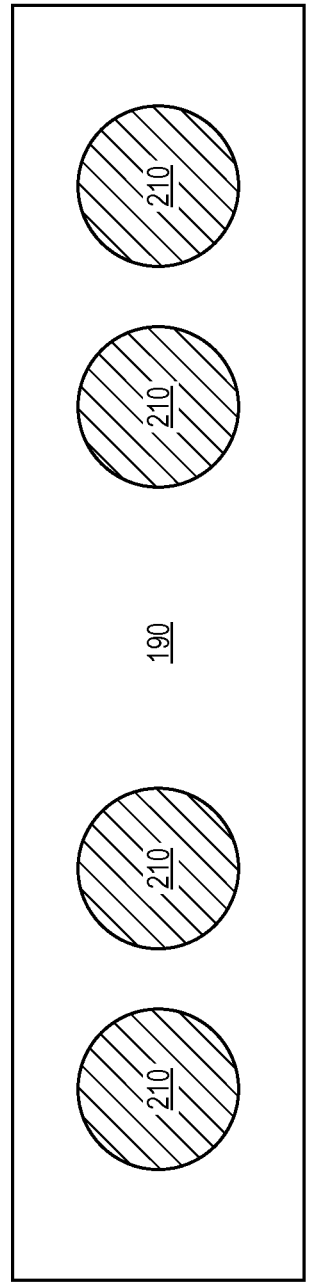
FIG. 4n
FIG. 4o

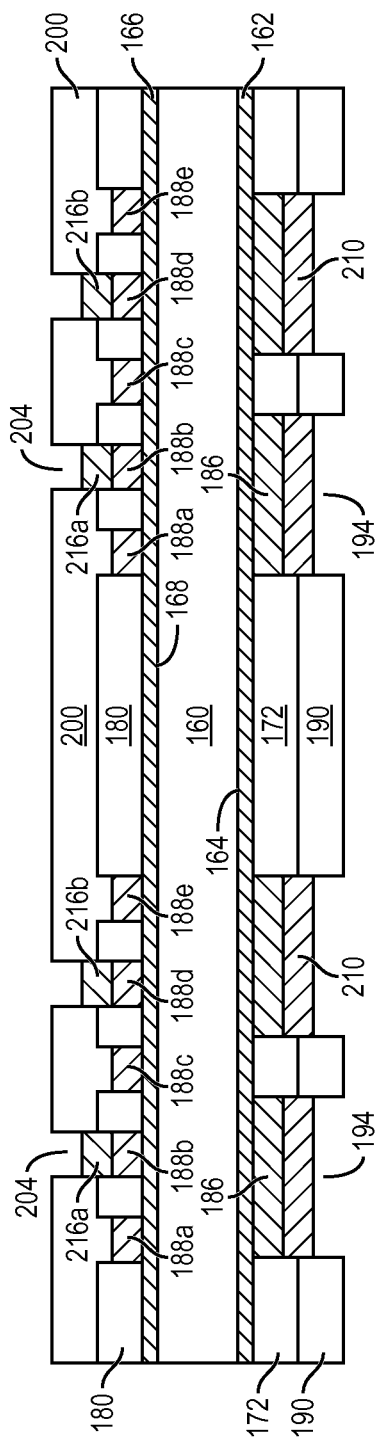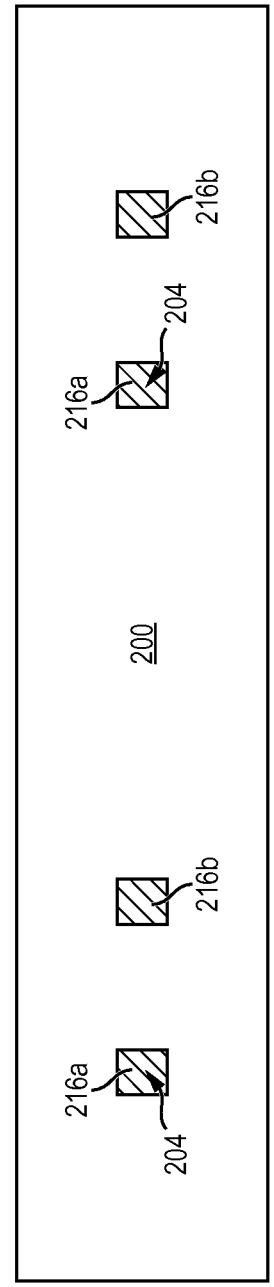
FIG. 4p
FIG. 4q

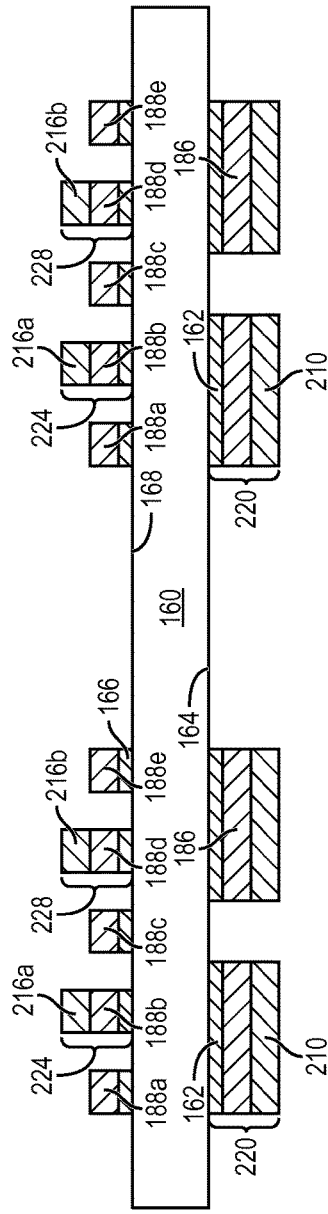
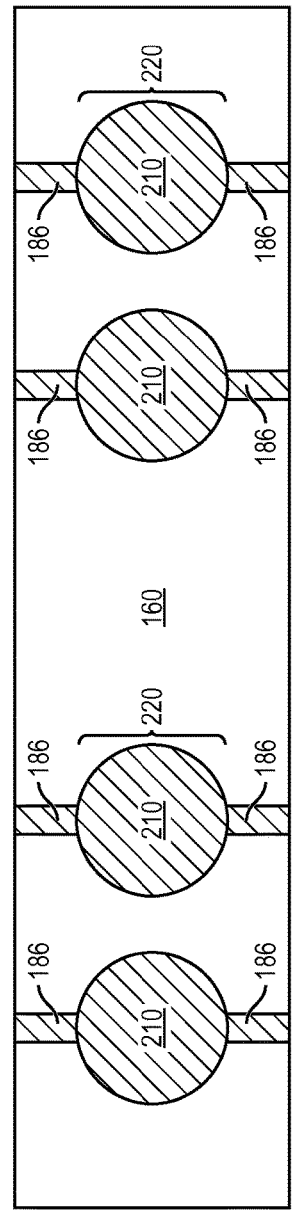
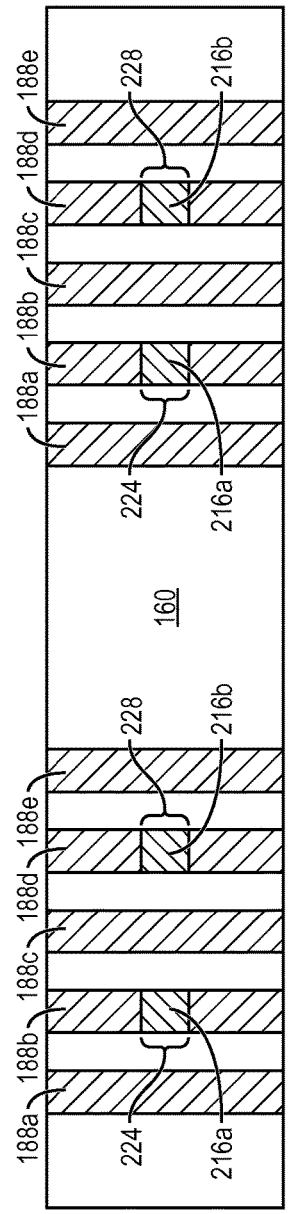
FIG. 4r
FIG. 4s
FIG. 4t

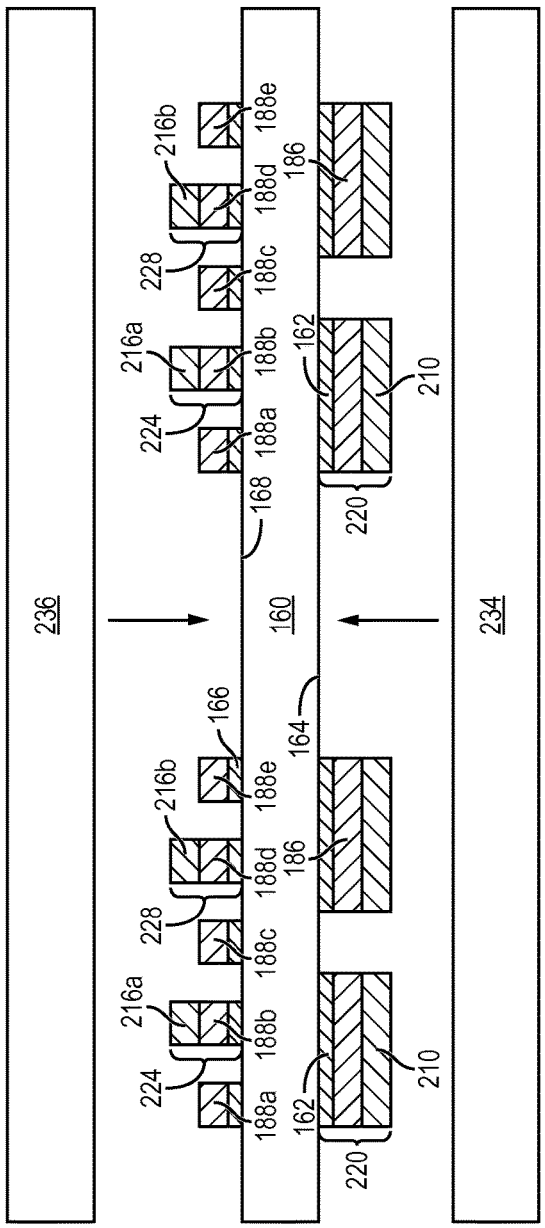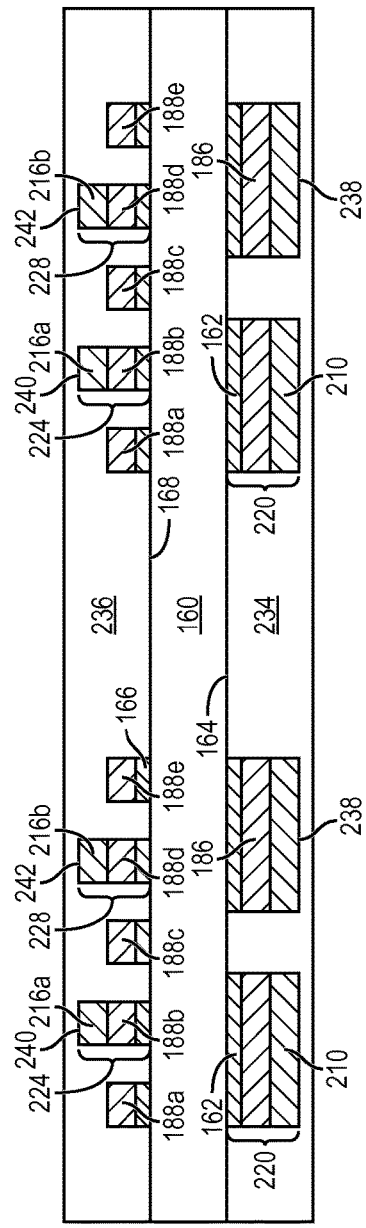
FIG. 5a
FIG. 5b

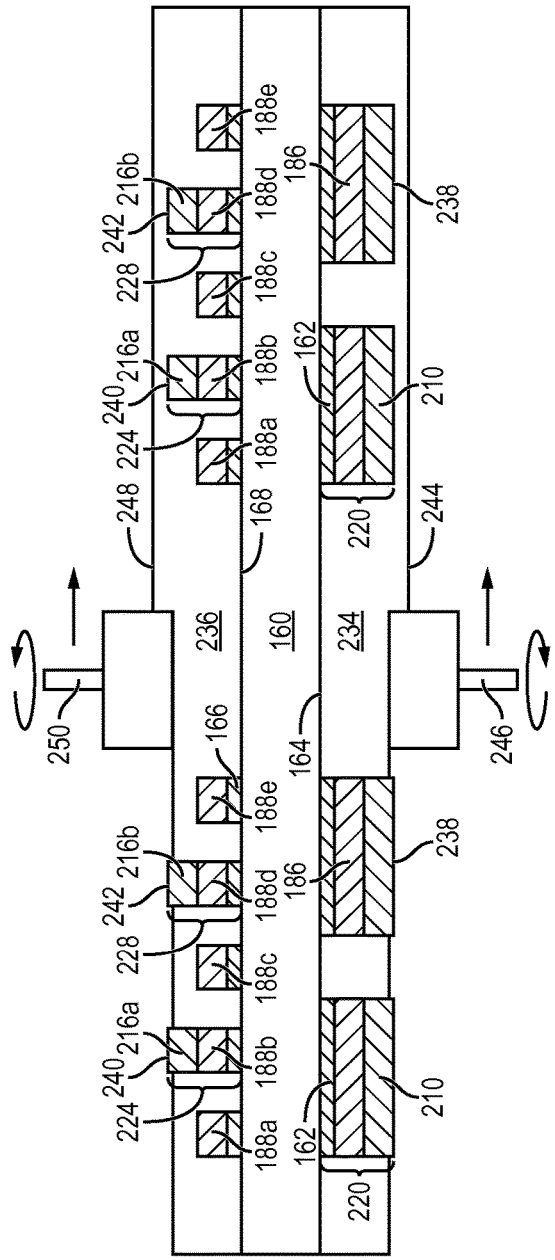
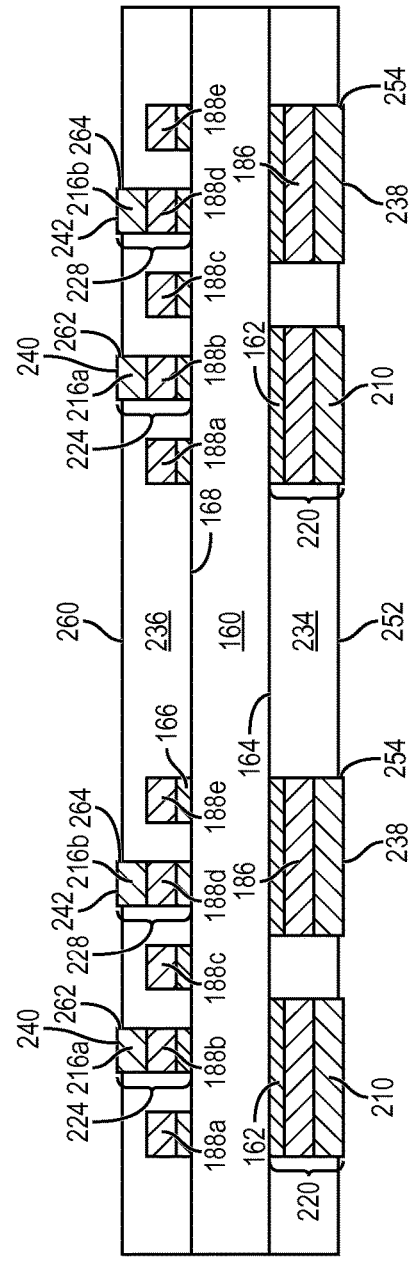
FIG. 5c
FIG. 5d

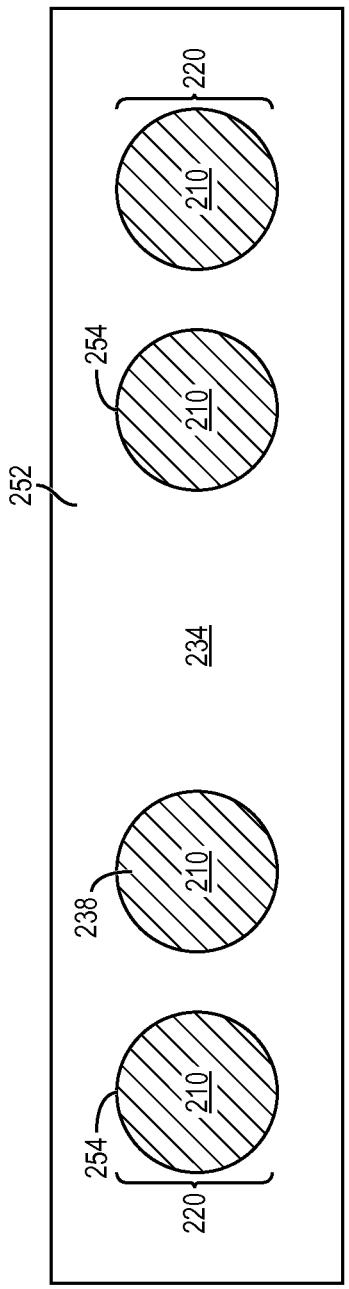
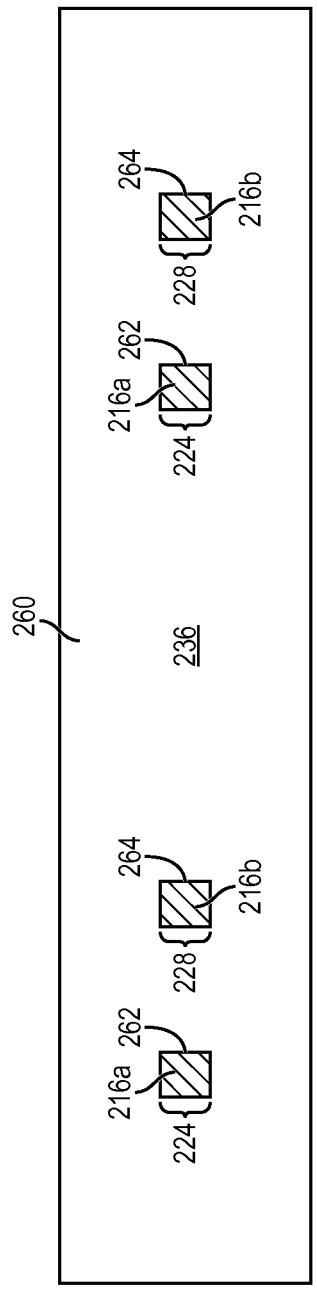

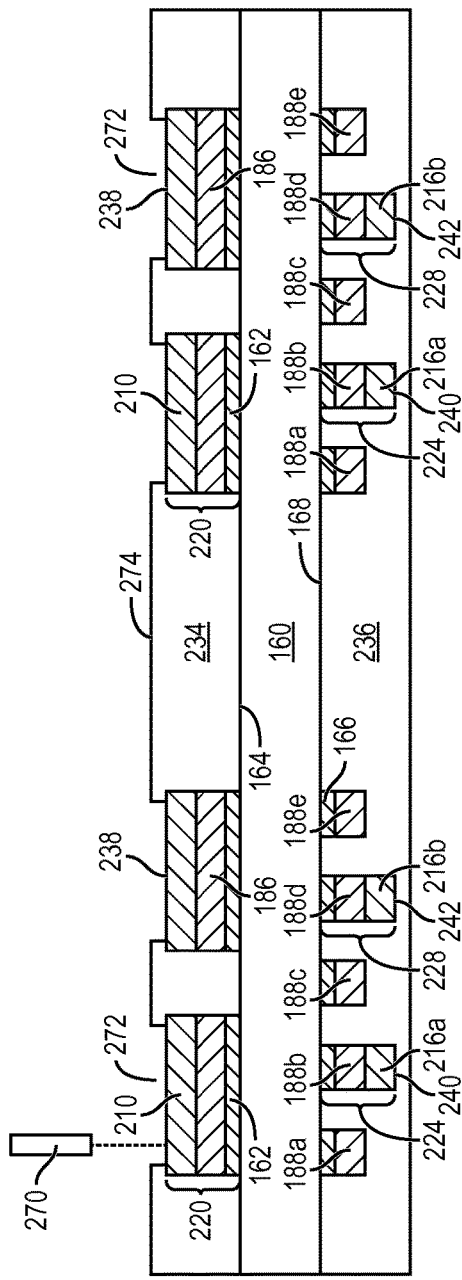
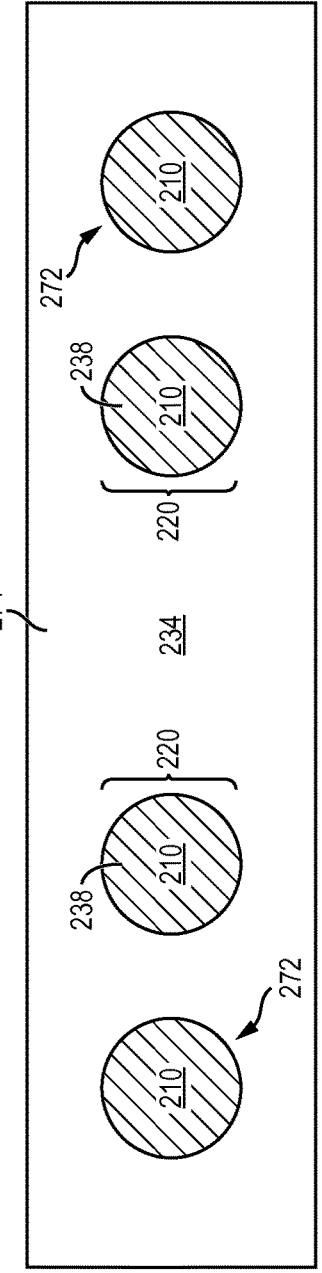
FIG. 7a
FIG. 7b

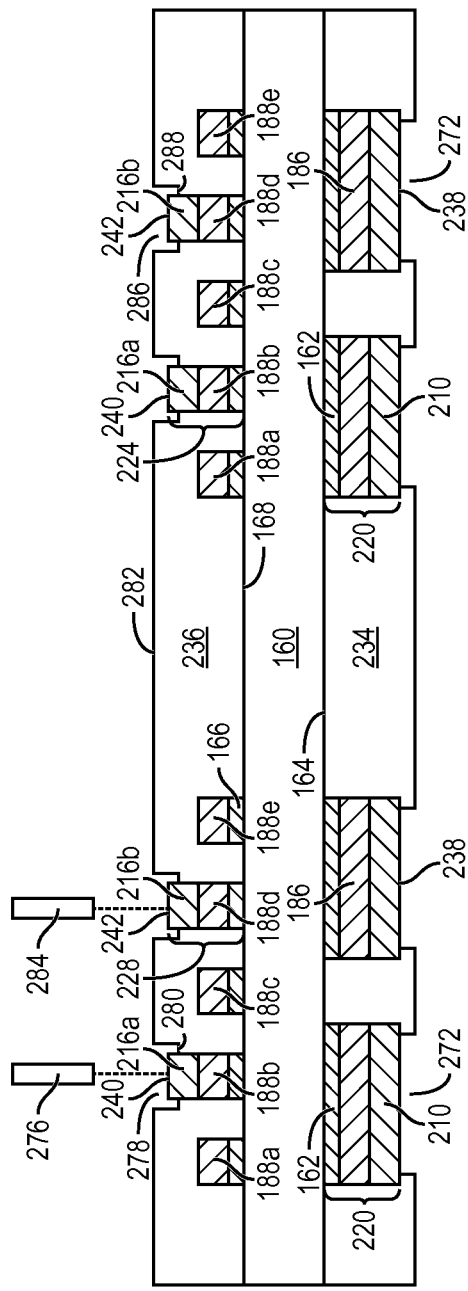
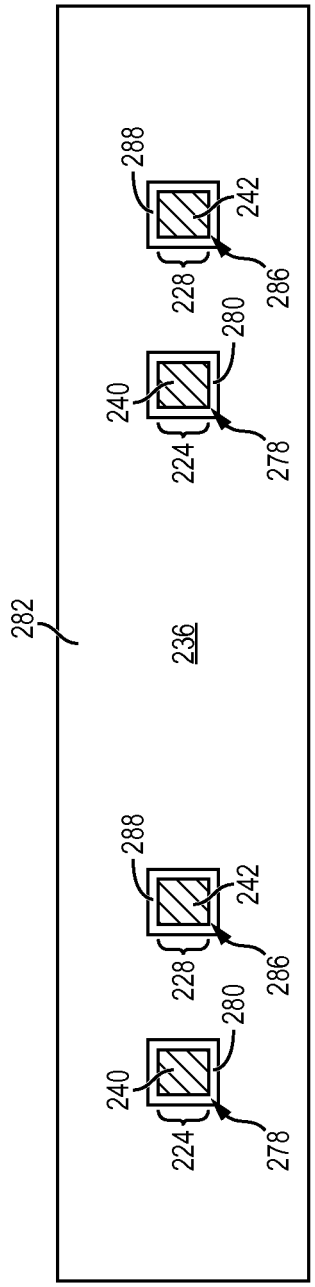
FIG. 7c
FIG. 7d

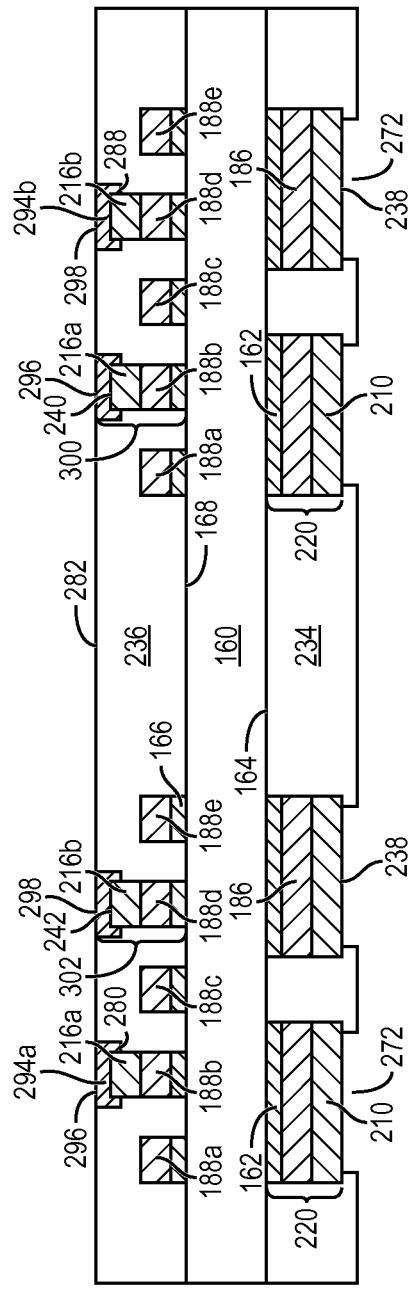
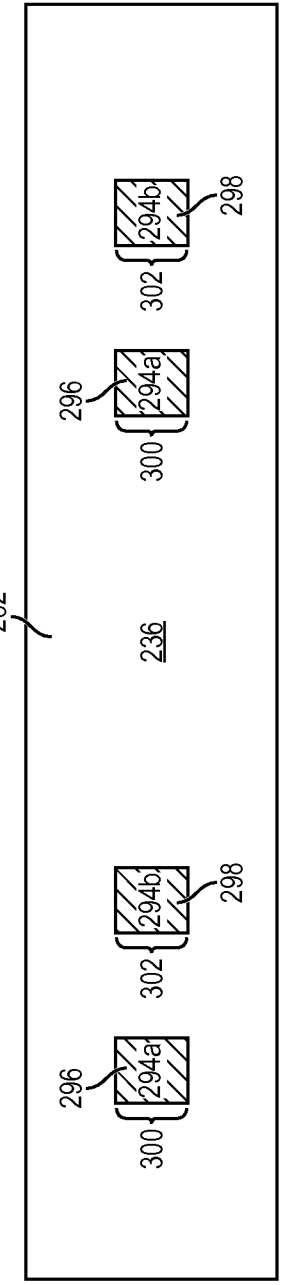
FIG. 9a
FIG. 9b

SEMICONDUCTOR DEVICE AND METHOD OF FORMING DUPLEX PLATED BUMP-ON-LEAD PAD OVER SUBSTRATE FOR FINER PITCH BETWEEN ADJACENT TRACES

CLAIM TO DOMESTIC PRIORITY

The present application is a continuation of U.S. patent application Ser. No. 13/424,710, now abandoned, filed Mar. 20, 2012, which application is incorporated herein by reference.

FIELD OF THE INVENTION

The present invention relates in general to semiconductor devices and, more particularly, to a semiconductor device and method of forming a duplex plated bump-on-lead pad over a substrate for finer pitch between adjacent traces.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions, such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor package can include a semiconductor die with conductive bumps formed over contact pads on an active surface of the die. A substrate has a plurality of conductive traces or contact pads formed on a surface of the substrate. The semiconductor die is mounted to the substrate by reflowing the bumps to establish a metallurgical and electrical connection with the substrate. However, unless precise alignment between the bumps and the bond pads is maintained, bridging defects or electrical shorts can occur between the bumps and adjacent conductive traces. In addition, the temperature and pressure during reflow is known to cause the molten bump material to flow laterally and potentially contact adjacent conductive traces, resulting in bridging defects or short circuit conditions. Defects from electrical shorts lower manufacturing yield and increase cost. In order to avoid manufacturing defects, conventional semiconductor packages require a distance or clearance, often at least 15 micrometers (μm), between the edge of the conductive bumps and adjacent conductive traces to avoid electrical shorts between the conductive bumps and the adjacent conductive traces during reflow. The required clearance between conductive bumps and adjacent conductive traces reduces signal trace routing density and increases the necessary pitch between adjacent bumps on the semiconductor package.

SUMMARY OF THE INVENTION

A need exists for fine pitch between adjacent conductive traces on a substrate while minimizing electrical shorts between semiconductor die bumps and adjacent conductive traces. Accordingly, in one embodiment, the present invention is a method of making a semiconductor device comprising the steps of providing a substrate, forming a conductive layer over the substrate to provide electrical interconnect laterally across the substrate, forming a BOL over a first portion of the conductive layer and vertically offset from a second portion of the conductive layer, forming an insulating layer over the substrate to completely cover and electrically isolate a surface of the second portion of the conductive layer opposite the substrate, and removing a portion of the insulating layer to the BOL.

In another embodiment, the present invention is a method of making a semiconductor device comprising the steps of providing a substrate, forming a plurality of conductive segments over the substrate, forming a BOL over a first one of the conductive segments and vertically offset from a second one of the conductive segments, and forming an insulating layer over the substrate to electrically isolate a surface of the second one of the conductive segments opposite the substrate.

In another embodiment, the present invention is a method of making a semiconductor device comprising the steps of providing a substrate, forming a conductive layer over the substrate, forming a BOL over a first portion of the conductive layer and vertically offset from a second portion of the conductive layer, and forming an insulating layer over the substrate to completely cover a surface of the second portion of the conductive layer opposite the substrate.

In another embodiment, the present invention is a semiconductor device comprising a substrate and conductive layer formed over the substrate. A BOL is formed over a first portion of the conductive layer and vertically offset from a second portion of the conductive layer. An insulating layer is formed over the substrate to completely cover a surface of the second portion of the conductive layer opposite the substrate.

BRIEF DESCRIPTION OF THE DRAWINGS

FIGS. 3a-3h illustrate a semiconductor wafer with a plurality of semiconductor die having composite bump structures;

FIGS. 5a-5f illustrate a process of forming a lamination layer over a substrate;

FIGS. 7a-7d illustrate a process of removing a portion of a lamination layer using laser direct ablation (LDA);

FIGS. 9a-9b illustrate a process of forming a duplex plated BOL pad with a wide BOL pad over a substrate;

DETAILED DESCRIPTION OF THE DRAWINGS

Figure 1:
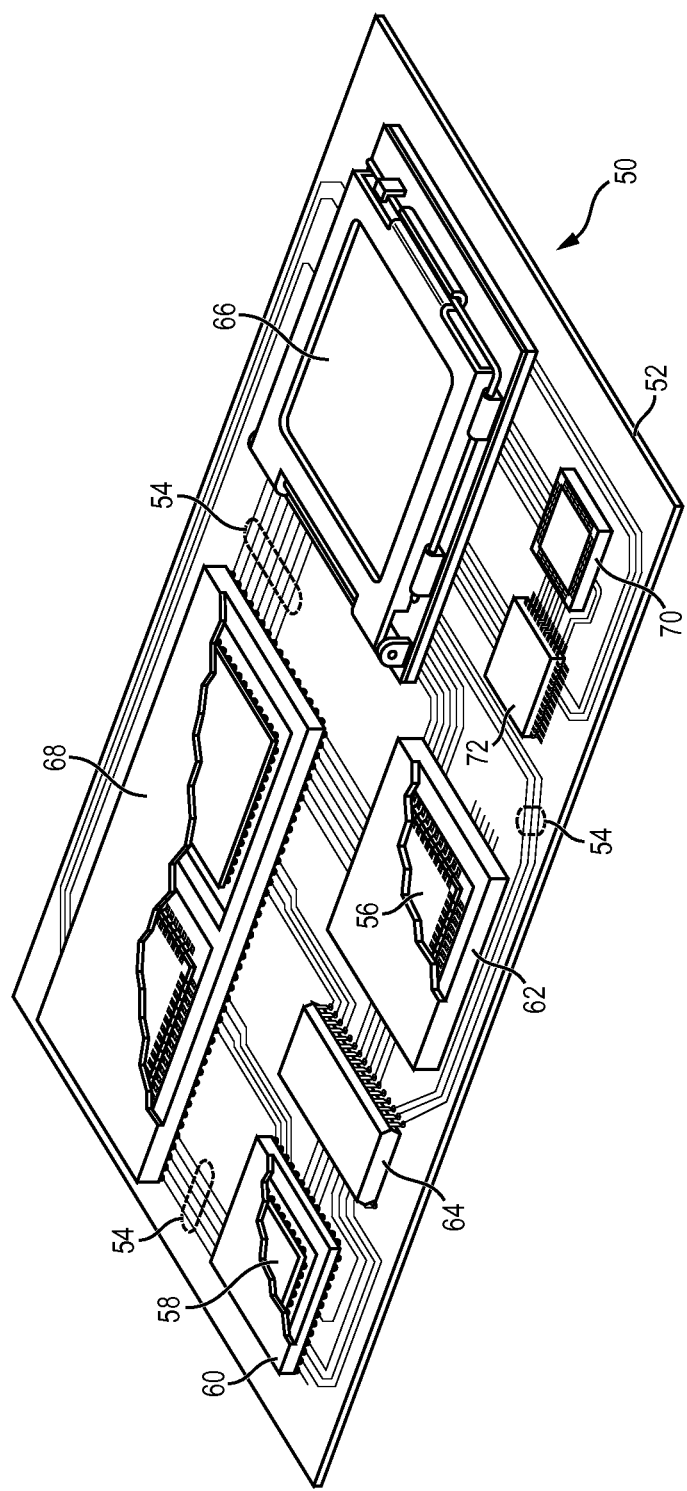
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
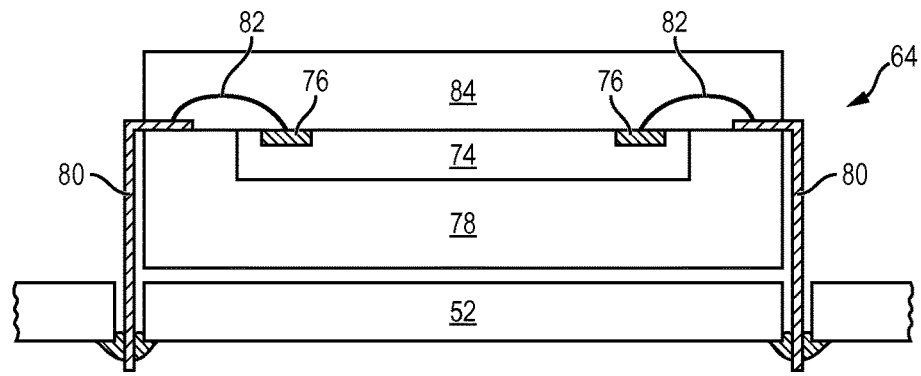
FIGS. 2a-2c illustrate further detail of the representative semiconductor packages mounted to the PCB.
Figure 2B:
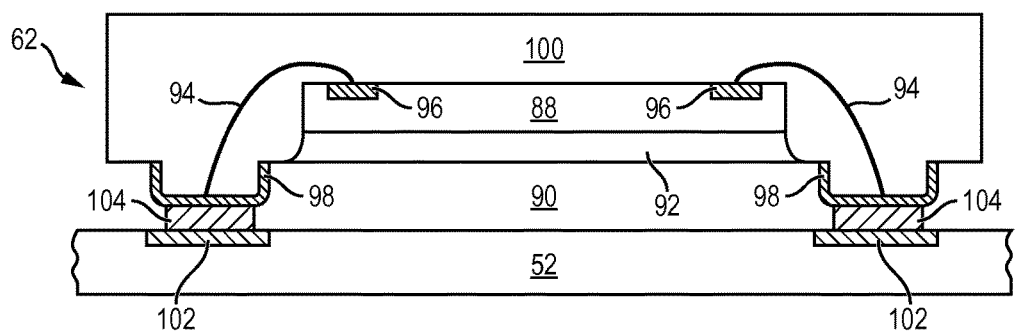
Figure 2C:
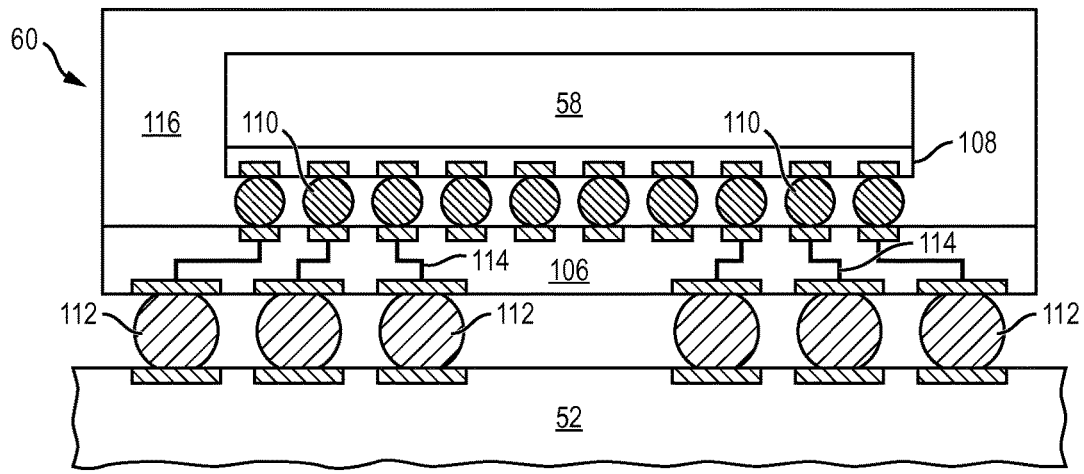

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
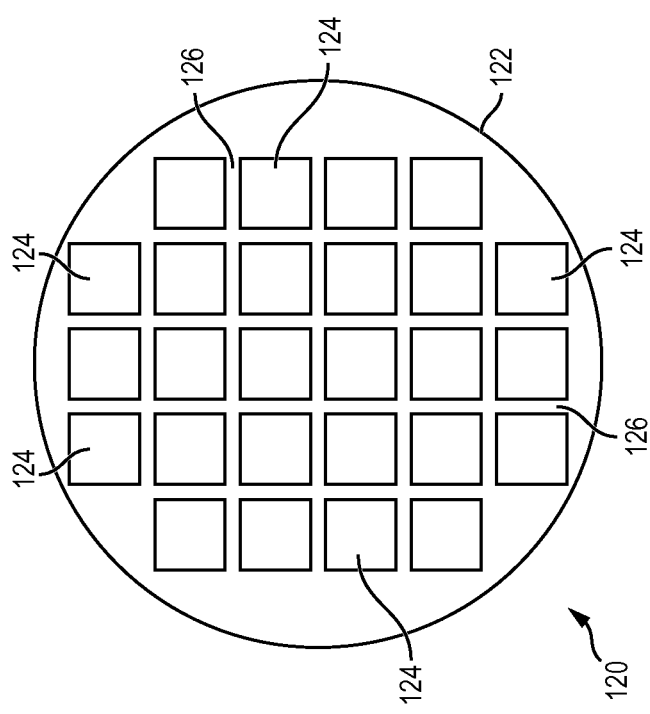

FIGS. 3a-3h illustrate, in relation to FIGS. 1 and 2a-2c, a process of forming a semiconductor wafer with a plurality of semiconductor die having composite bump structures. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
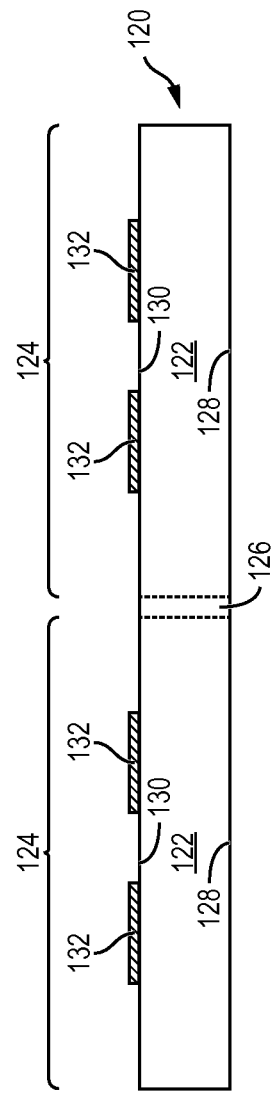

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
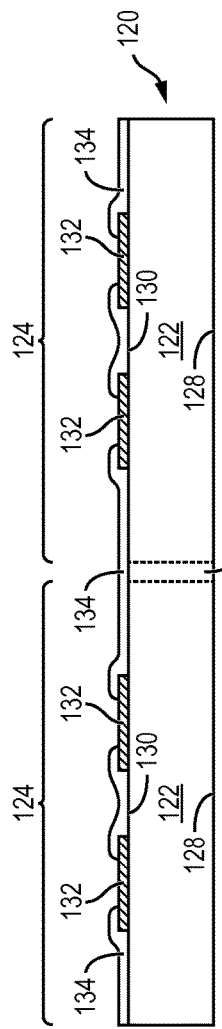

In FIG. 3c, an insulating or passivation layer 134 is conformally applied over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 134 follows a contour of active surface 130 and conductive layer 132. A portion of insulating layer 134 is removed by an etching process through a patterned photoresist layer to expose conductive layer 132. A portion of conductive layer 132 remains covered by insulating layer 134.

Figure 3D:
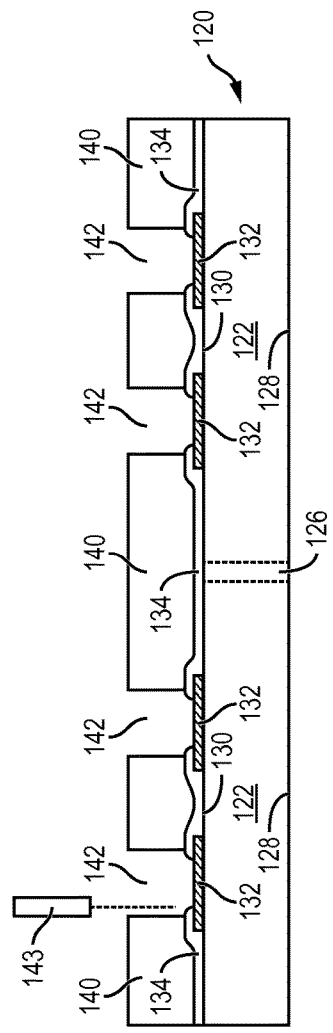

In FIG. 3d, a patterning or photoresist layer 140 is formed over insulating layer 134 and conductive layer 132 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. A portion of photoresist layer 140 is removed by an etching process through a patterned photoresist layer to form patterned openings 142 and expose insulating layer 134 and conductive layer 132. Alternatively, a portion of photoresist layer 140 is removed by laser direct ablation (LDA) using laser 143 to form patterned openings 142 and expose insulating layer 134 and conductive layer 132. In one embodiment, patterned openings 142 have a circular cross-sectional area configured to form conductive pillars with a cylindrical shape including a circular cross-section. In another embodiment, patterned openings 142 have a rectangular cross-sectional area configured to form conductive pillars with a cubic shape including a rectangular cross-section.

Figure 3E:
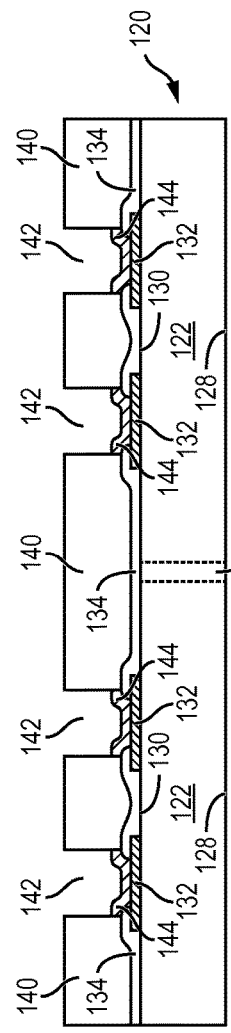

In FIG. 3e, an electrically conductive layer 144 is conformally applied over insulating layer 134 and conductive layer 132, within openings 142, using a patterning and metal deposition process such as printing, PVD, CVD, sputtering, electrolytic plating, and electroless plating. Alternatively, conductive layer 144 can be formed over insulating layer 134 and conductive layer 132 prior to forming photoresist layer 140. Conductive layer 144 can be one or more layers of Al, Cu, Sn, Ti, Ni, Au, Ag, or other suitable electrically conductive material. In one embodiment, conductive layer 144 is a multi-layer stack including a seed layer, barrier layer, and adhesion layer. The seed layer can be titanium copper (TiCu), titanium tungsten copper (TiWCu), or tantalum nitrogen copper (TaNCu). The barrier layer can be Ni, nickel vanadium (NiV), platinum (Pt), palladium (Pd), TiW, or CrCu, or other suitable material. The adhesion layer can be Ti, TiN, TiW, Al, or chromium (Cr), or other suitable material. Conductive layer 144 follows the contour of insulating layer 134 and conductive layer 132. Conductive layer 144 is electrically connected to conductive layer 132.

In FIG. 3f, an electrically conductive material 146 is deposited within openings 142 and over conductive layer 144 using an evaporation, sputtering, electrolytic plating, electroless plating, or screen printing process. Conductive material 146 can be Cu, Al, tungsten (W), Au, solder, or other suitable electrically conductive material. In one embodiment, conductive material 146 is deposited by plating Cu in the patterned openings 142 of photoresist layer 140.

In FIG. 3g, photoresist layer 140 is removed by an etching process to leave individual conductive pillars 148 having a height ranging from 2-120 micrometers (pm). Conductive pillars 148 can have a cylindrical shape with a circular or oval cross-section, or conductive pillars 148 can have a cubic shape with a rectangular cross-section. In another embodiment, conductive pillars 148 can be implemented with stacked bumps or stud bumps.

In FIG. 3h, an electrically conductive bump material is deposited over conductive pillars 148 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be reflowed to form a rounded bump cap 150. The combination of conductive pillars 148 and bump cap 150 constitute a composite interconnect structure or bump 152 with a non-fusible portion (conductive pillar 148) and fusible portion (bump cap 150). In one embodiment, the pitch between adjacent bumps 152 ranges from 90 to 150 µm.

Semiconductor wafer 120 is singulated through insulating layer 134 and saw street 126 with saw blade or laser cutting tool 154 into individual semiconductor die 124 with composite interconnect structures 152.

Figure 4A:
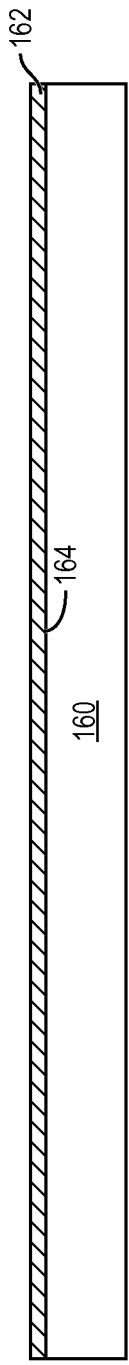
FIGS. 4a-4t illustrate a process of forming duplex plated contact pads and BOL pads over a substrate.

FIGS. 4a-4t illustrate, in relation to FIGS. 1 and 2a-2c, a process of forming duplex plated contact pads and BOL pads over a substrate. FIG. 4a shows a substrate or PCB 160 suitable for mounting semiconductor die 124. Substrate 160 can be one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, substrate 160 contains one or more laminated insulating or dielectric layers. Substrate 160 can also contain one or more conductive layers operating as redistribution layers (RDLs) providing electrical interconnect laterally and vertically through substrate 160.

An electrically conductive layer 162 is formed over surface 164 of substrate 160 using a patterning and metal deposition process such as printing, PVD, CVD, sputtering, and electrolytic plating. In one embodiment, conductive layer 162 is formed using electroless plating or flash plating and covers the entire surface 164 of substrate 160 and operates as a base electroless plating seed layer for subsequent plating of conductive layers. Conductive layer 162 can be one or more layers of Al, Cu, Sn, Ti, Ni, Au, Ag, or other suitable electrically conductive material.

Figure 4B:
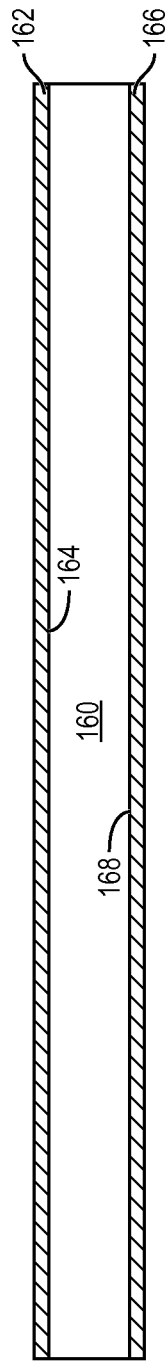

In FIG. 4b, an electrically conductive layer 166 is formed over surface 168 of substrate 160 using a patterning and metal deposition process such as printing, PVD, CVD, sputtering, and electrolytic plating. In one embodiment, conductive layer 166 is formed using electroless plating or flash plating and covers the entire surface 168 of substrate 160 and operates as a base electroless plating seed layer for subsequent plating of conductive layers. Conductive layer 166 can be one or more layers of Al, Cu, Sn, Ti, Ni, Au, Ag, or other suitable electrically conductive material.

Figure 4C:
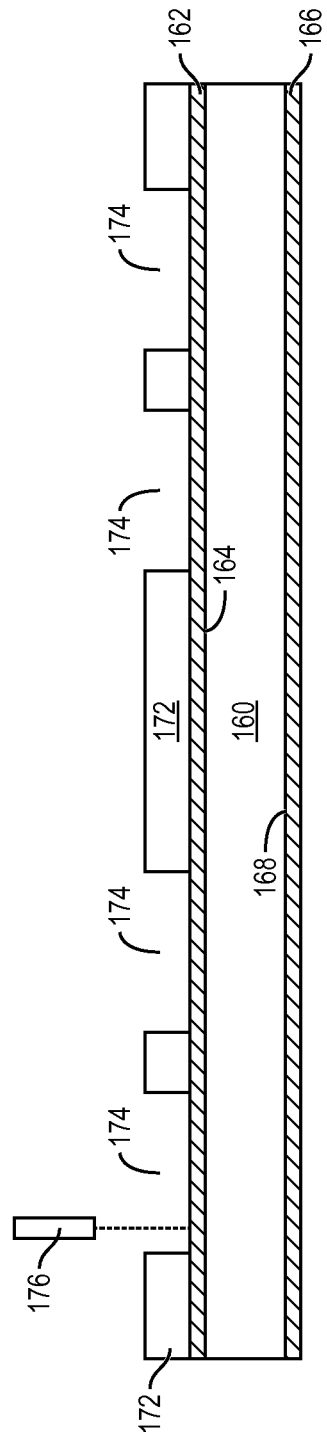

In FIG. 4c, a patterning or photoresist layer 172 is formed over conductive layer 162 using printing, spin coating, or spray coating. In one embodiment, photoresist layer 172 is a dry film photoresist lamination with a thickness ranging from 20-25 µm. In other embodiments that utilize an insulating layer for patterning, the insulating layer can include one or more layers of SiO2, Si3N4, SiON, Ta2O5, Al2O3, or other material having similar structural properties. A portion of photoresist layer 172 is removed by an etching process to form openings 174 and to partially expose conductive layer 162. Alternatively, a portion of photoresist layer 172 is removed by laser direct ablation (LDA) using laser 176 to form openings 174 and to partially expose conductive layer 162. Openings 174 coincide with the location of subsequently formed conductive traces and contact pads.

Figure 4D:
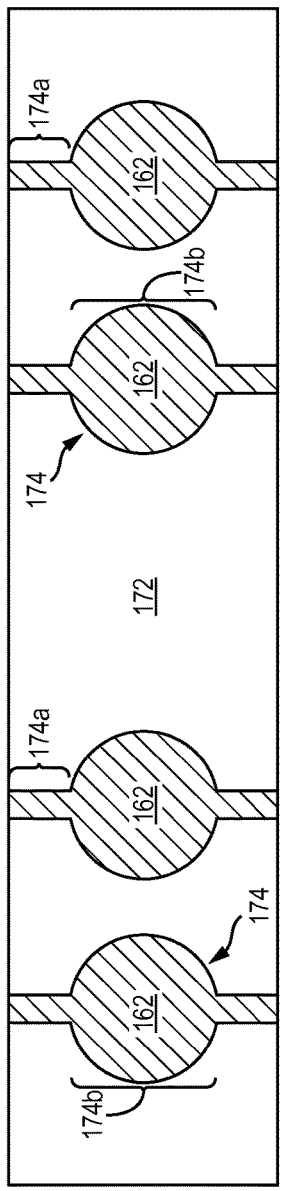

FIG. 4d shows a top or plan view of openings 174. In one embodiment, shown in FIG. 4d, openings 174 have a narrow portion 174a configured to coincide with subsequently formed conductive traces. Opening 174 has a wide or flared portion 174b configured to coincide with subsequently formed contact pads. Flared portion 174b is formed in a generally cylindrical shape with a generally circular cross-section. In another embodiment, flared portion 174b is formed in a generally cubic shape with a generally rectangular cross-section. The shape and pattern of opening 174 can vary according to the design and function of substrate 160 and opening 174b can have a cross-section or footprint that is generally oval or square. In another embodiment, opening 174 does not have a flared portion 174b, and opening 174 has a uniform width with parallel sidewalls running laterally across the substrate.

Figure 4E:
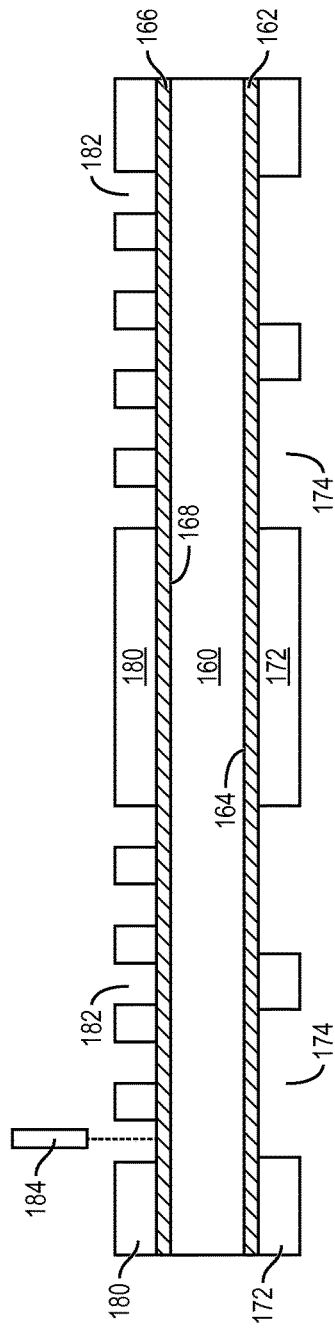

In FIG. 4e, the assembly from FIG. 4c is inverted and a patterning or photoresist layer 180 is formed over conductive layer 166 using printing, spin coating, or spray coating. In one embodiment, photoresist layer 180 is a dry film photoresist lamination with a thickness ranging from 20-25 μm. In other embodiments that utilize an insulating layer for patterning, the insulating layer can include one or more layers of SiO2, Si3N4, SiON, Ta2O5, Al2O3, or other material having similar structural properties. A portion of photoresist layer 180 is removed by an etching process to form openings 182 and to partially expose conductive layer 166. Alternatively a portion of photoresist layer 180 is removed by LDA using laser 184 to form openings 182 and to partially expose conductive layer 166. Openings 182 coincide with the location of subsequently formed conductive traces and bump-on-lead (BOL) pads. Openings 182 are formed as a series of channels or trenches for depositing conductive material over substrate 160 to operate as conductive traces to provide electrical interconnect laterally across substrate 160. In one embodiment openings 182 have a cross-sectional width ranging from 15-25 micrometers (μm). In one embodiment, the distance between adjacent openings 182 ranges from 15-25 μm.

Figure 4F:
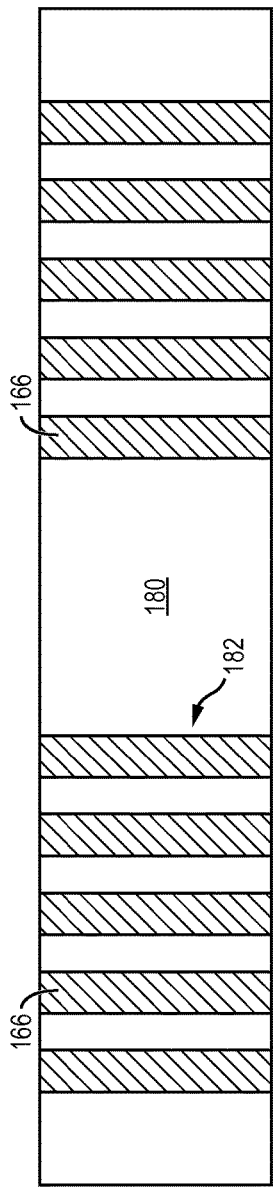

FIG. 4f shows a top or plan view of openings 182. A portion of conductive layer 166 is exposed through openings 182. Openings 182 operate as a series of channels or trenches running laterally across substrate 160 for subsequently depositing conductive material over substrate 160 as conductive traces. The pattern and shape of openings 182 can vary according to the design and function of substrate 160.

In FIG. 4g, an electrically conductive layer 186 is formed within openings 174 using a suitable patterning and metal deposition process, such as printing, PVD, CVD, sputtering, electrolytic plating, and electroless plating. Conductive layer 186 can be one or more layers of Al, Cu, Sn, Ni, Au, Ag, or other suitable electrically conductive material. Collectively, conductive layer 186 and the portion of conductive layer 162 within a footprint of conductive layer 186 operate as conductive traces, escape lines, or leads to provide electrical interconnection laterally across substrate 160. Portions of conductive layer 186 can be electrically common or electrically isolated according to the design and function of substrate 160.

An electrically conductive layer 188 is formed within openings 182 using a suitable patterning and metal deposition process, such as printing, PVD, CVD, sputtering, electrolytic plating, and electroless plating. Conductive layer 188 can be one or more layers of Al, Cu, Sn, Ni, Au, Ag, or other suitable electrically conductive material. Conductive layer 188 is formed as a plurality of conductive segments 188a-188e. Collectively, conductive layers 188a-188e and the portion of conductive layer 166 within a footprint of conductive layers 188a-188e operate as conductive traces or leads for providing electrical interconnect laterally across substrate 160. The width of individual conductive segments 188a-188e and the pitch between conductive segments 188a-188e can vary according to the design and function of semiconductor die 124. In one embodiment, conductive layers 188a-188e each have a width ranging from 15-25 μm. In one embodiment, the pitch between adjacent conductive layers 188a-188e ranges from 15-25 μm. The individual portions of conductive layers 188a-188e can be electrically common or electrically isolated according to the design and function of semiconductor die 124.

FIG. 4h shows a top or plan view of conductive layer 186 from FIG. 4g. Conductive layer 186 has a narrow portion 186a with a uniform width and parallel edges operating as a conductive trace to provide electrical interconnection laterally across substrate 160. Conductive layer 186 has a wide or flared portion 186b providing a greater surface area for subsequently mounting external semiconductor devices to substrate 160. Flared portion 186b has a generally circular footprint. The shape of flared portion 186b can vary according to the design and function of substrate 160 and can be generally rectangular or oval. In another embodiment, conductive layer 186 does not have a flared portion 186b and conductive layer 186 has a uniform width across the substrate with parallel edges.

FIG. 4i shows a top or plan view of conductive layer 188a-188e from FIG. 4g. In particular, conductive layers 188a-188e are formed in openings 182 with a uniform width and parallel edges. The individual conductive layers 188a-188e run parallel across substrate 160. Conductive layers 188a-188e operate as a series of conductive traces or leads to provide electrical interconnect laterally across substrate 160. The shape and pattern of conductive layers 188a-188e can vary according to the design and function of semiconductor die 124. The individual portions of conductive layers 188a-188e can be electrically common or electrically isolated according to the design and function of semiconductor die 124.

In FIG. 4j, a patterning or photoresist layer 190 is formed over photoresist layer 172 and conductive layer 186 using printing, spin coating, or spray coating. In one embodiment, photoresist layer 190 is a dry film photoresist lamination with a thickness ranging from 20-30 μm. In other embodiments that utilize an insulating layer for patterning, the insulating layer can include one or more layers of SiO2, Si3N4, SiON, Ta2O5, Al2O3, or other material having similar structural properties. A portion of photoresist layer 190 is removed by an etching process to form openings 194 and to partially expose conductive layer 186. Alternatively, a portion of photoresist layer 190 is removed by LDA using laser 196 to form openings 194 and to partially expose conductive layer 186. Openings 194 coincide with the location of subsequently formed contact pads operating as an interconnect site or bonding site for mechanical and electrical contact with external components.

FIG. 4k shows a top or plan view of openings 194. The shape of openings 194 can vary according to the design and function of substrate 160. In one embodiment, openings 194 are formed in a generally cylindrical shape and have a generally circular cross-section, as shown in FIG. 4k. In another embodiment, openings 194 are formed in a generally cubic shape and have a generally rectangular cross-section. Openings 194 expose flared portion 186b of conductive layer 186. Photoresist layer 190 maintains coverage over narrow portion 186a of conductive layer 186.

Figure 4L:
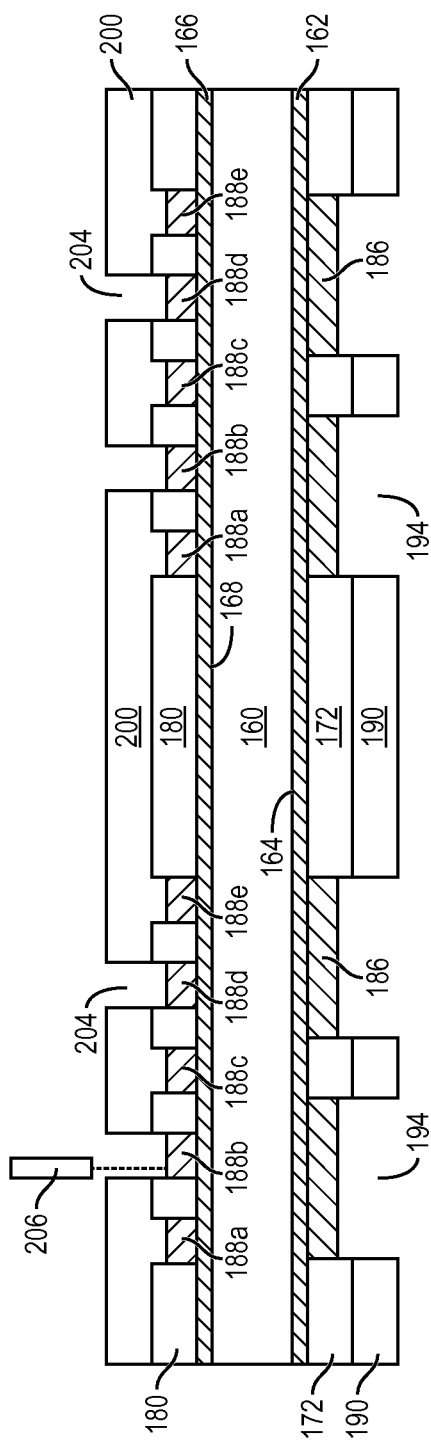

In FIG. 4l, a patterning or photoresist layer 200 is formed over photoresist layer 180 and conductive layer 188 using printing, spin coating, or spray coating. In one embodiment, photoresist layer 200 is a dry film photoresist lamination with a thickness ranging from 20-25 μm. In other embodiments that utilize an insulating layer for patterning, the insulating layer can include one or more layers of SiO2, Si3N4, SiON, Ta2O5, Al2O3, or other material having similar structural properties. A portion of photoresist layer 200 is removed by an etching process to form openings 204 and to partially expose conductive layers 188b and 188d.

Alternatively, a portion of photoresist layer 200 is removed by LDA using laser 206 to form openings 204 and to partially expose conductive layers 188*b* and 188*d*. Openings 204 have a cross-sectional width equal to the cross-sectional width of conductive layers 188*b* and 188*d*. Openings 204 coincide with the location of subsequently formed BOL pads.

Figure 4M:
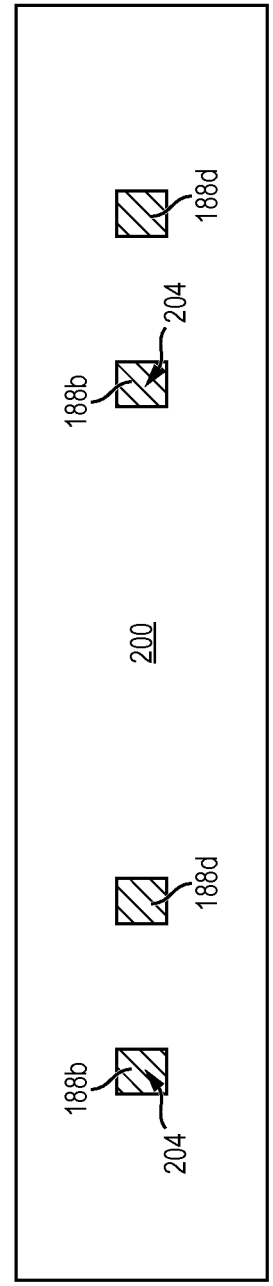

FIG. 4*m* shows a top or plan view of openings 204. In particular, openings 204 are formed in a generally cubic shape and have a generally rectangular cross-section or footprint. The shape and size of openings 204 can vary according to the design and function of substrate 160 and can have a footprint or cross-section that is generally circular, square, or oval. Openings 204 expose portions of conductive layers 188*b* and 188*d* but photoresist layer 200 maintains coverage over conductive layers 188*b* and 188*d* outside the footprint of openings 204. Photoresist layer 200 also maintains coverage over alternating adjacent conductive layers 188*a*, 188*c*, and 188*e*.

In FIG. 4*n* an electrically conductive layer 210 is formed over conductive layer 186 within openings 194 using a suitable patterning and metal deposition process, such as printing, PVD, CVD, sputtering, electrolytic plating, and electroless plating. Conductive layer 210 can be one or more layers of Al, Cu, Sn, Ni, Au, Ag, or other suitable electrically conductive material.

FIG. 4*o* shows a top or plan view of conductive layer 210. Conductive layer 210 has a generally circular footprint. The shape of conductive layer 210 can vary according to the design and function of substrate 160. In one embodiment, conductive layer 210 has a generally square, oval, or rectangular footprint.

In FIG. 4*p*, an electrically conductive layer 216 is formed within openings 204 using a patterning and metal deposition process such as printing, PVD, CVD, sputtering, electrolytic plating, and electroless plating. Conductive layer 216 can be one or more layers of Al, Cu, Sn, Ti, Ni, Au, Ag, or other suitable electrically conductive material. Conductive layer 216 is formed as a plurality of conductive segments 216*a* and 216*b* over conductive layers 188*b* and 188*d*, respectively. The width of conductive layer 216 can vary according to the design and function of substrate 160. In one embodiment, conductive layer 216 has a cross-sectional width equal to the cross-sectional width of conductive layers 188*a*-188*e*. Conductive layer 216 is vertically offset above conductive layers 188*a*-188*e*.

FIG. 4*q* shows a top or plan view of conductive layer 216. Conductive layer 216*a* is formed over conductive layer 188*b*, within opening 204. Conductive layer 216*b* is formed over conductive layer 188*d*, within opening 204. Conductive layers 216*a* and 216*b* have a generally rectangular footprint or cross-section. The shape and pattern of conductive layers 216*a* and 216*b* can vary according to the design and function of substrate 160. In another embodiment, conductive layers 216*a* and 216*b* have a generally rectangular, circular, or oval footprint. Photoresist layer 200 maintains coverage over conductive layers 188*b* and 188*d* outside a footprint of conductive layers 216*a* and 216*b*. Photoresist layer 200 also maintains coverage over conductive layers 188*a*, 188*c*, and 188*e*.

In FIG. 4*r*, photoresist layers 172 and 190 and the portion of conductive layer 162 outside a footprint of conductive layer 210 are removed by an etching process to expose surface 164 of substrate 160. Similarly, photoresist layers 180 and 200 and the portion of conductive layer 166 outside a footprint of conductive layers 188*a*-188*e* are removed by an etching process to expose surface 168 of substrate 160.

Collectively, conductive layer 210 and the portions of conductive layers 186 and 162 within a footprint of conductive layer 210 operate as a duplex plated contact pad 220 for electrical and mechanical connection with external devices. Contact pad 220 has duplex plated conductive layers 186 and 210 formed over a base electroless plating conductive layer 162. Contact pad 220 is vertically offset with respect to the conductive traces or escape lines including conductive layers 186 and 162 outside the footprint of conductive layer 210. Thus contact pad 220 has a thickness greater than the combined thickness of conductive layers 186 and 162. The portion of conductive layers 186 and 162 outside a footprint of conductive layer 210 operate as conductive traces, escape lines, or leads for providing electrical interconnect laterally across the substrate.

Collectively, conductive layer 216*a*, conductive layer 188*b*, and the portion of conductive layer 166 within a footprint of conductive layer 216*a* operate as a duplex plated BOL pad 224 for electrical and mechanical BOL interconnection with external devices. Similarly, conductive layer 216*b*, conductive layer 188*d*, and the portion of conductive layer 166 within a footprint of conductive layer 216*b* operate as a duplex plated BOL pad 228 for electrical and mechanical BOL interconnection with external devices. BOL pads 224 and 228 have duplex plated conductive layers 188 and 216 formed over a base electroless plating layer 166. Conductive layers 216*a* and 216*b* of BOL pads 224 and 228 are vertically offset from conductive layer 188. Thus, BOL pads 224 and 228 have a thickness greater than the combined thickness of conductive layers 188 and 166. The portion of conductive layers 188*a*-188*e* and 166 outside a footprint of conductive layer 216 operate as conductive traces or leads for providing electrical interconnect laterally across the substrate.

Conductive layers 188 and 186 can be electrically connected or electrically isolated according to the design and function of substrate 160. Conductive layers 162 and 166 serve as base electroless plating conductive layers during the duplex plating process to form contact pad 220 and BOL pads 224 and 228. By using conductive layers 162 and 166 as base electroless plating conductive layers, the duplex plating process for forming BOL pads 224 and 228 and contact pad 220 to create a vertical offset from the conductive traces does not require additional electroless plating layers. Avoiding additional electroless plating layers to form BOL pads 224 and 228 and contact pad 220 reduces the number of manufacturing steps and reduces cost.

FIG. 4*s* shows a top view of contact pad 220. Conductive layer 210 is formed over conductive layers 186 and 162. Conductive layer 210 has a cross-sectional width greater than the cross-sectional width of conductive layers 186 and 162 outside a footprint of conductive layer 210. Thus, contact pad 220 is wider or flares out relative to the width of conductive layer 186 outside the footprint of conductive layer 210. Conductive layer 210 is vertically offset with respect to conductive layer 186. Thus, contact pad 220 has a height or thickness greater than the collective height or thickness of conductive layers 162 and 186. Conductive layer 186 is formed over conductive layer 162. The portions of conductive layers 186 and 162 outside a footprint of contact pad 220 operate as conductive traces, escape lines, or leads providing electrical interconnect laterally across substrate 160.

FIG. 4*t* shows a top view of BOL pads 224 and 228. Conductive layer 216 is formed over conductive layer 188 and 166. Conductive layer 216 has a cross-sectional width equal to the cross-sectional width of conductive layers 188 and 162 outside a footprint of conductive layer 216. Thus, BOL pads 224 and 228 have a cross-sectional width equal to the portions of conductive layers 188 and 162 outside the footprint of BOL pads 224 and 228. Conductive layer 216 is vertically offset with respect to conductive layer 188. Thus, BOL pads 224 and 228 have a height or thickness greater than the collective height or thickness of conductive layers 166 and 188. Conductive layer 188 is formed over conductive layer 166. The portions of conductive layers 188 and 166 outside a footprint of BOL pads 224 and 228 operate as conductive traces or leads providing electrical interconnect laterally across substrate 160.

FIGS. 5a-5f illustrate, in relation to FIGS. 1 and 2a-2c, a process of forming a lamination layer over a substrate. A lamination layer 234 is deposited over surface 164 of substrate 160 and conductive layers 162, 186, and 210 using a suitable lamination process such as applying heat and pressure. Lamination layer 234 can include one or more laminated layers of prepreg, FR-4, FR-1, CEM-1, or CEM-3 with a combination of phenolic cotton paper, epoxy, resin, woven glass, matte glass, polyester, and other reinforcement fibers or fabrics or other suitable material having similar insulating and structural properties. Lamination layer 234 serves as an insulating layer between adjacent conductive layers 186 and 162. Similarly, a lamination layer 236 is deposited over surface 168 of substrate 160 and conductive layers 166, 186, and 216 using a suitable lamination process such as applying heat and pressure. Lamination layer 236 can be one or more laminated layers of prepreg, FR-4, FR-1, CEM-1, or CEM-3 with a combination of phenolic cotton paper, epoxy, resin, woven glass, matte glass, polyester, and other reinforcement fibers or fabrics or other suitable material having similar insulating and structural properties. Lamination layer 236 serves as an insulating layer between adjacent conductive layers 188 and 166.

After depositing lamination layer 234 over surface 164 of substrate 160, a portion of lamination layer 234 covers surface 238 of conductive layer 210, as shown in FIG. 5b. Similarly, after depositing lamination layer 236 over surface 168 of substrate 160, a portion of lamination layer 236 covers surface 240 of BOL pad 224 and surface 242 of BOL pad 228. Lamination layers 234 and 236 have a coefficient of thermal expansion (CTE) similar to the CTE of substrate 160, which reduces the incidence of warpage of substrate 160.

In FIG. 5c, the exposed surface 244 of lamination layer 234 undergoes a grinding operation with grinder 246 to planarize and reduce a thickness of lamination layer 234 and to remove a portion of lamination layer 234 over contact pad 220. Alternatively, a chemical etch, polishing, or desmearing process can be used to planarize lamination layer 234 and to remove a portion of lamination layer 234 over contact pad 220. Similarly, the exposed surface 248 of lamination layer 236 undergoes a grinding operation with grinder 250 to planarize and reduce a thickness of lamination layer 236 and to remove a portion of lamination layer 236 over BOL pads 224 and 228. Alternatively, a chemical etch, polishing, or desmearing process can be used to planarize lamination layer 236 and to remove a portion of lamination layer 236 over BOL pads 224 and 228.

After removing a portion of lamination layer 234 over contact pad 220, a portion of contact pad 220 is exposed, including surface 238 of conductive layer 210, as shown in FIG. 5d. The exposed surface 238 of conductive layer 210 extends or protrudes outside of lamination layer 234, such that surface 238 is vertically offset with respect to exposed surface 252 of lamination layer 234. Thus, a portion of sidewall 254 of contact pad 220 is exposed outside of lamination layer 234. In another embodiment, surface 238 of conductive layer 210 is coplanar with exposed surface 252 of lamination layer 234. Lamination layer 234 maintains coverage over conductive layers 186 and 162 outside the footprint of conductive layer 210 and operates as an insulating layer between adjacent conductive layers 186 and 162.

After removing a portion of lamination layer 236 over BOL pads 224 and 228, a portion of BOL pad 224 and a portion of BOL pad 228 is exposed, including surface 240 of BOL pad 224 and surface 242 of BOL pad 228. Surface 240 of BOL pad 224 and surface 242 of BOL pad 228 are vertically offset with respect to exposed surface 260 of lamination layer 236. Thus, a portion of sidewall 262 of BOL pad 224 extends outside or is exposed above lamination layer 236. Similarly, a portion of sidewall 264 of BOL pad 228 extends outside or is exposed above lamination layer 236. Lamination layer 236 maintains coverage over conductive layers 188a-188e and 166 outside a footprint of conductive layers 216a and 216b.

FIG. 5e shows a top or plan view of contact pad 220 from FIG. 5d. Conductive layer 210 is exposed through lamination layer 234 to expose contact pad 220. Lamination layer 234 maintains coverage over conductive layers 186 and 162 outside the footprint of conductive layer 210. Lamination layer 234 operates as an insulating layer between adjacent conductive layers 186 and 162. An exposed surface 238 of conductive layer 210 is vertically offset with respect to exposed surface 252 of lamination layer 234 such that a portion of sidewall 254 of contact pad 220 is exposed above lamination layer 234. Contact pad 220 has a generally circular cross section. The shape and size of contact pad 220 can vary according to the design and function of substrate 160. In one embodiment, contact pad 220 has a generally square, oval, or rectangular shape or cross-section.

FIG. 5f shows a top or plan view of BOL pads 224 and 228 from FIG. 5d. Conductive layers 216a and 216b are exposed through lamination layer 236. A portion of sidewall 262 of BOL pad 224 extends outside or is exposed above lamination layer 236. Similarly, a portion of sidewall 264 of BOL pad 228 extends outside or is exposed above lamination layer 236. Lamination layer 236 maintains coverage over conductive layers 188a-188e outside a footprint of BOL pads 224 and 228. BOL pads 224 and 228 have a generally rectangular cross section. The shape and size of BOL pads 224 and 228 can vary according to the design and function of substrate 160. In one embodiment, BOL pads 224 and 228 have a generally square, circular, or oval shape or cross-section.

Figure 6A:
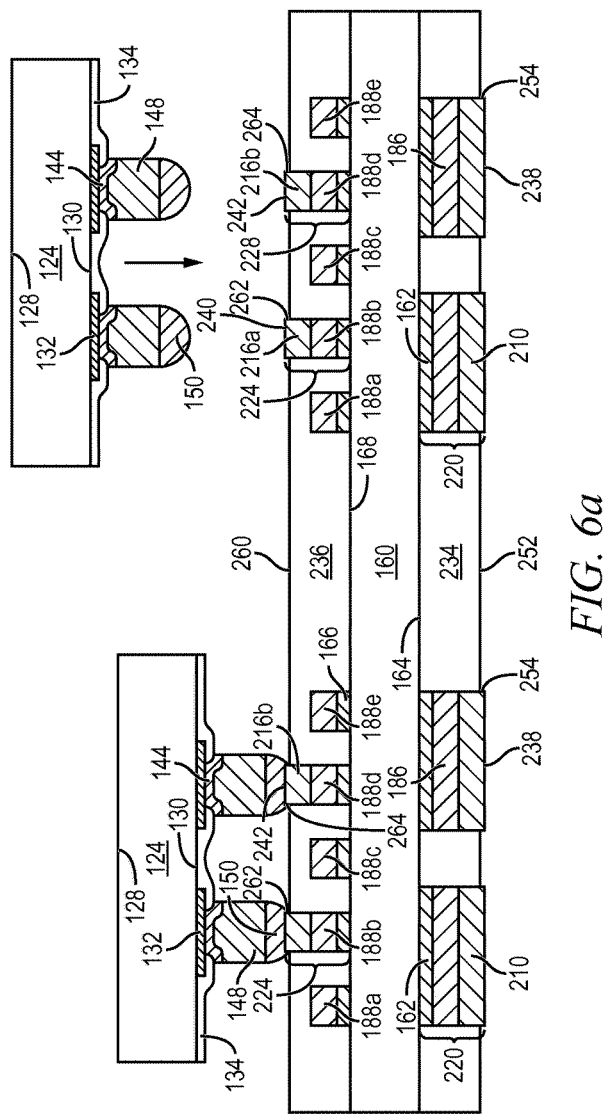
FIGS. 6a-6b illustrate a process of mounting a semiconductor die over a substrate having conductive duplex plated BOL pads.
Figure 6B:
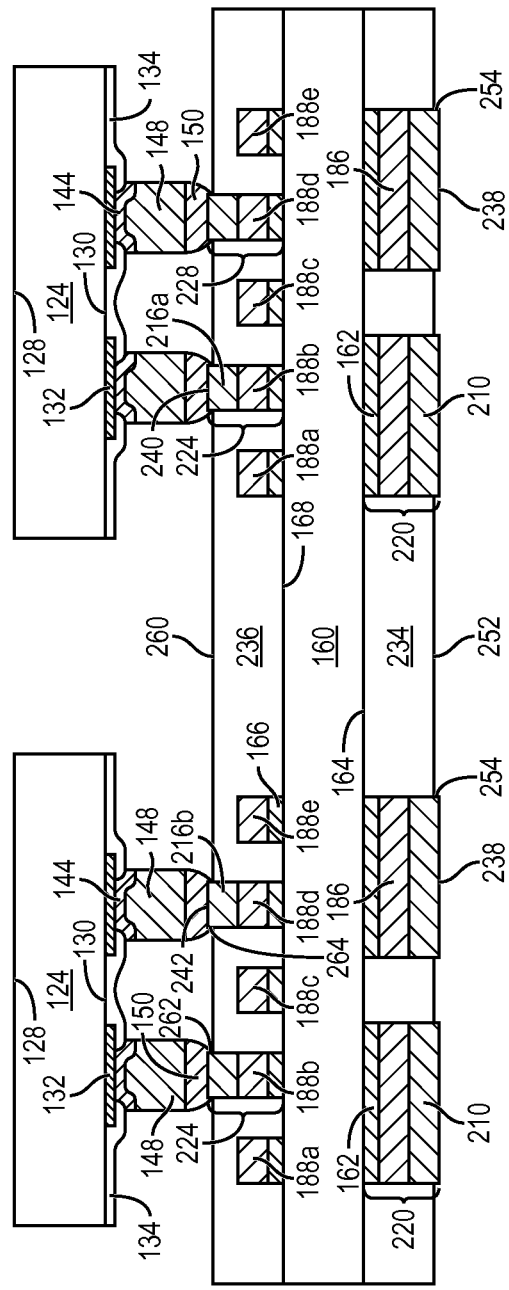

FIGS. 6a-6b illustrate, in relation to FIGS. 1 and 2a-2c, a process of mounting a semiconductor die over a substrate having conductive duplex plated BOL pads. In FIG. 6a, semiconductor die 124 from FIGS. 3a-3h is positioned over and mounted to substrate 160 using a pick and place operation with active surface 130 oriented toward substrate 160 and conductive pillar 148 and bump cap 150 aligned with BOL pads 224 and 228. Bump caps 150 are reflowed and semiconductor die 124 is pressed onto substrate 160 to metallurgically connect conductive pillar 148 and bump cap 150 to BOL pads 224 and 228 in a BOL configuration. Bump caps 150 can also be compression bonded or thermocompression bonded to BOL pads 224 and 228. Compression bonding uses pressure in excess of 10 megapascals (MPa) (1450 psi) at temperatures below 200° C. to bond materials via solid-state diffusion. Typical materials bonded using compression bonding include indium (In), Au, lead (Pb), and Pb/Sn alloys. Thermocompression bonding uses elevated temperatures in conjunction with pressure to bond materials. Typical materials bonded using thermocompression bonding include Cu, Au, and Al. In one embodiment, thermocompression bonding is used to bond bump caps 150 to BOL pads 224 and 228 by applying 30 MPa of pressure at 300° C. for 2 minutes.

FIG. 6b shows semiconductor die 124 mounted to substrate 160 with conductive pillar 148 and bump cap 150 metallurgically connected to BOL pads 224 and 228 in a BOL configuration. BOL pads 224 and 228 have a cross-sectional width less than the cross sectional width of conductive pillar 148 and bump cap 150 of semiconductor die 124. Thus, after mounting semiconductor die 124 over substrate 160, bump cap 150 covers the exposed portion of sidewall 262 of BOL pad 224 and bump cap 150 covers the exposed portion of sidewall 264 of BOL pad 228. Conductive pillar 148 provides standoff distance between semiconductor die 124 and substrate 160.

Because lamination layer 236 maintains coverage over conductive layers 188a-188e and 166 outside the footprint of BOL pads 224 and 228, the adjacent conductive traces including conductive layers 188a-188e are insulated. Insulating adjacent conductive layers 188a-188e reduces the risk of ion migration between conductive layers 188a-188e and reduces the risk of electrical short between adjacent conductive layers 188a-188e during reflow of bump caps 150. The reduced risk of ion migration and electrical short between conductive layers 188a-188e allows for reduced distance between adjacent conductive traces. Furthermore, a conventional semiconductor substrate requires a minimum of 15 μm of clearance between the edge of a conductive bump and an adjacent conductive trace and a minimum pitch between adjacent bumps ranging from 105-155 μm in order to avoid electrical short during bump reflow. By insulating adjacent conductive layers 188a-188e, additional clearance between conductive pillar 148 and conductive layers 188a-188e is not necessary. Thus, the pitch between adjacent bumps can be reduced, which allows for higher signal routing density and reduced package size. In one embodiment, the pitch between adjacent conductive pillars 148 ranges between 90-150 μm. Furthermore, insulating adjacent conductive layers 188a-188e facilitates electrical open/short testing at the substrate level using a test pin, because lamination layer 236 reduces the likelihood of the test pin touching adjacent traces.

FIGS. 7a-7d illustrate, in relation to FIGS. 1 and 2a-2c, a process of removing a portion of a lamination layer using laser direct ablation (LDA). Continuing from FIG. 5b, the assembly is inverted and a portion of lamination layer 234 is removed by LDA using laser 270 to form opening 272 and to expose surface 238 of conductive layer 210, as shown in FIG. 7a. Lamination layer 234 maintains coverage over a perimeter of contact pad 220 such that the cross-sectional width of opening 272 is less than the cross-sectional width of conductive layer 210. After removing a portion of lamination layer 234 over contact pad 220, a portion of contact pad 220 is exposed including surface 238 of conductive layer 210. The exposed surface 238 is vertically offset from an exposed surface 274 of lamination layer 234 such that surface 238 is recessed within lamination layer 234. In another embodiment, a portion of lamination layer 234 is removed by LDA using laser 270, such that surface 238 of conductive layer 210 is coplanar with or protrudes beyond the exposed surface of lamination layer 234.

FIG. 7b shows a top or plan view of opening 272. Opening 272 has a generally circular shape or footprint. The shape of opening 272 can vary according to the design and function of substrate 160. In another embodiment, opening 272 has a generally oval, square, or rectangular cross-section or footprint. The exposed surface 238 of conductive layer 210 is vertically offset from exposed surface 274 of lamination layer 234 such that surface 238 is recessed within lamination layer 234. Lamination layer 234 maintains coverage over a perimeter of conductive layer 210 and conductive layers 186 and 162 outside a footprint of conductive layer 210.

In FIG. 7c, the assembly from FIG. 7a is inverted and a portion of lamination layer 236 is removed by LDA using laser 276 to form opening 278 and to expose surface 240 of BOL pad 224. Opening 278 has a cross-sectional width greater than the width of BOL pad 224, such that a recessed surface 280 of lamination layer 236 is exposed around a peripheral area of BOL pad 224. Surface 240 of BOL pad 224 is recessed with respect to exposed surface 282 of lamination layer 236. A portion of lamination layer 236 is also removed using laser 284 to form opening 286 and to expose surface 242 of BOL pad 228. Opening 286 has a cross-sectional width greater than the width of BOL pad 228, such that a recessed surface 288 of lamination layer 236 is exposed around a peripheral area of BOL pad 228. Surface 242 of BOL pad 228 is recessed with respect to exposed surface 282 of lamination layer 236.

FIG. 7d shows a top or plan view of openings 278 and 286. Openings 278 and 286 have a generally square cross-section. The shape of openings 278 and 286 can vary according to the design and function of substrate 160. Opening 278 has a cross-sectional width greater than the width of BOL pad 224, such that recessed surface 280 of lamination layer 236 is exposed around a peripheral area of BOL pad 224. Similarly, opening 286 has a cross-sectional width greater than the width of BOL pad 228, such that recessed surface 288 of lamination layer 236 is exposed around a peripheral area of BOL pad 224.

Figure 8A:
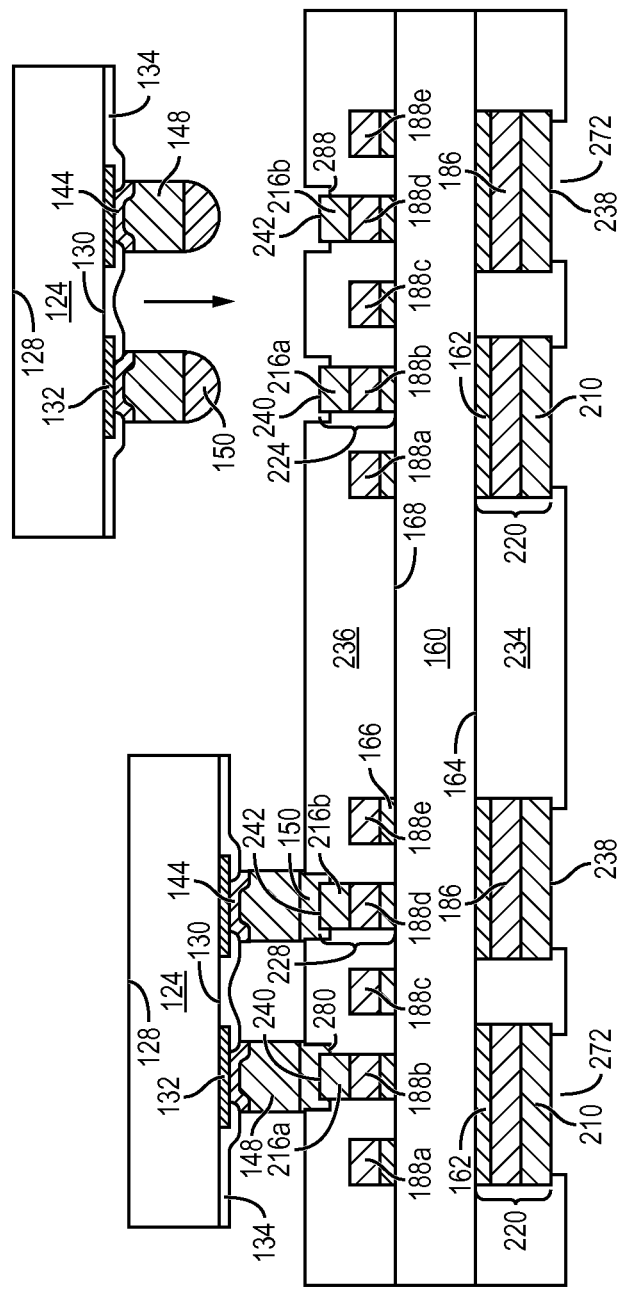
FIGS. 8a-8b illustrate a process of mounting a semiconductor die over a substrate.
Figure 8B:
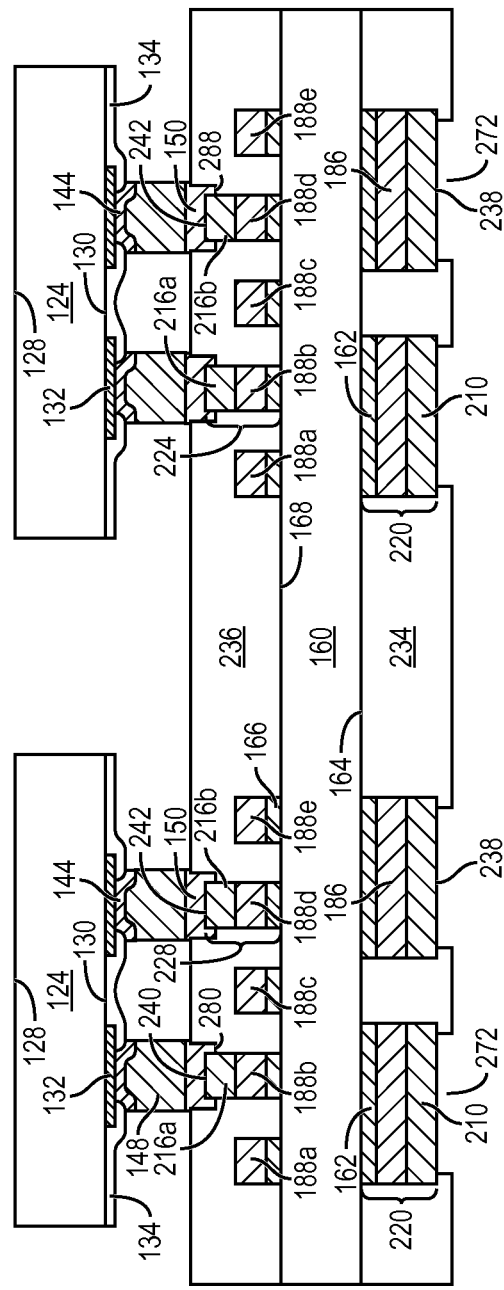

FIGS. 8a-8b illustrate, in relation to FIGS. 1 and 2a-2c, a process of mounting a semiconductor die over a substrate. In FIG. 8a, semiconductor die 124 from FIGS. 3a-3h is positioned over and mounted to substrate 160 using a pick and place operation with active surface 130 oriented toward substrate 160 and conductive pillar 148 and bump cap 150 aligned with BOL pads 224 and 228. Bump caps 150 are reflowed and semiconductor die 124 is pressed onto substrate 160 to metallurgically connect conductive pillar 148 and bump cap 150 to BOL pads 224 and 228 in a BOL configuration. Bump caps 150 can also be compression bonded or thermocompression bonded to BOL pads 224 and 228. Compression bonding uses pressure in excess of 10 MPa (1450 psi) at temperatures below 200° C. to bond materials via solid-state diffusion. Typical materials bonded using compression bonding include In, Au, Pb, and Pb/Sn alloys. Thermocompression bonding uses elevated temperatures in conjunction with pressure to bond materials. Typical materials bonded using thermocompression bonding include Cu, Au, and Al. In one embodiment, thermocompression bonding is used to bond bump caps 150 to BOL pads 224 and 228 by applying 30 MPa of pressure at 300° C. for 2 minutes.

FIG. 8b shows semiconductor die 124 mounted to substrate 160 with conductive pillar 148 and bump cap 150 metallurgically connected to BOL pads 224 and 228 in a BOL configuration. BOL pads 224 and 228 have a cross-sectional width less than the cross sectional width of conductive pillar 148 and bump cap 150 of semiconductor die 124. Thus, after mounting semiconductor die 124 over substrate 160, bump cap 150 covers the exposed portion of the sidewall of BOL pad 224 and bump cap 150 covers the exposed portion of the sidewall of BOL pad 228. Conductive pillar 148 provides standoff distance between semiconductor die 124 and substrate 160.

Because lamination layer 236 maintains coverage over conductive layers 188a-188e and 166 outside the footprint of BOL pads 224 and 228, the adjacent conductive traces including conductive layers 188a-188e are insulated. Insulating adjacent conductive layers 188a-188e reduces the risk of ion migration between conductive layers 188a-188e and reduces the risk of electrical short between adjacent conductive layers 188a-188e during reflow of bump caps 150. The reduced risk of ion migration and electrical short between conductive layers 188a-188e allows for reduced distance between adjacent conductive traces. Furthermore, a conventional semiconductor substrate requires a minimum of 15 μm of clearance between the edge of a conductive bump and an adjacent conductive trace and a minimum pitch between adjacent bumps ranging from 105-155 μm in order to avoid electrical short during bump reflow. By insulating adjacent conductive layers 188a-188e, additional clearance between conductive pillar 148 and conductive layers 188a-188e is not necessary. Thus, the pitch between adjacent bumps can be reduced allowing for higher signal routing density and reduced package size. In one embodiment, the pitch between adjacent conductive pillars 148 ranges between 90-150 μm. Furthermore, insulating adjacent conductive layers 188a-188e facilitates electrical open/short testing at the substrate level using a test pin, because lamination layer 236 reduces the likelihood of the test pin touching adjacent traces.

FIGS. 9a-9b illustrate, in relation to FIGS. 1 and 2a-2c, a process of forming a wide duplex plated BOL pad over a substrate. Continuing from FIG. 7d an electrically conductive layer 294 is formed within openings 278 and 286 using a suitable patterning and metal deposition process, such as printing, PVD, CVD, sputtering, electrolytic plating, and electroless plating. Conductive layer 294 can be one or more layers of Al, Cu, Sn, Ni, Au, Ag, or other suitable electrically conductive material. Conductive layer 294 is formed as a plurality of segments 294a and 294b over conductive layers 216a and 216b, respectively. Conductive layer 294a is formed over conductive layer 216a within opening 278. Conductive layer 294b is formed over conductive layer 216b within opening 286. Conductive layers 294a and 294b constitute wide BOL pads. Conductive layer 294a has an exposed surface 296 that is coplanar with exposed surface 282 of lamination layer 236. Conductive layer 294b has an exposed surface 298 that is coplanar with exposed surface 282 of lamination layer 236. Conductive layer 294a has a cross-sectional width greater than the cross-sectional width of conductive layer 216a. Similarly, conductive layer 294b has a cross-sectional width greater than the cross-sectional width of conductive layer 216b. Because the cross-sectional widths of conductive layers 294a and 294b are greater than the cross-sectional widths of conductive layers 216a and 216b, conductive layer 294 provides a greater surface area for mechanical and electrical contact with a subsequently mounted semiconductor package.

Collectively, conductive layer 216a, conductive layer 294a, and the portion of conductive layers 166 and 188b within a footprint of conductive layer 216a, constitute a duplex plated BOL pad 300 with conductive layer 294a constituting a wide BOL pad. Collectively, conductive layer 294b, conductive layer 216b, and the portion of conductive layers 166 and 188d within a footprint of conductive layer 216b, constitute a duplex plated BOL pad 302 with a wide BOL pad formed by conductive layer 294b. Conductive layers 294a and 294b of BOL pads 300 and 302 provide a slightly wider cross-sectional width than conductive layer 188 to provide a greater surface area for subsequent mechanical and electrical contact with a semiconductor die. Conductive layers 294a and 294b are vertically offset from conductive layers 188a-188e. Lamination layer 236 maintains coverage over conductive layers 188a-188e outside the footprint of BOL pads 300 and 302, which reduces the risk of electrical shorts and ion migration between adjacent conductive layers 188a-188e during subsequent reflow of conductive bump material.

FIG. 9b shows a top or plan view of conductive layer 294 disposed within lamination layer 236. Surface 296 of conductive layer 294a is coplanar with surface 282 of lamination layer 236. Surface 298 of conductive layer 294b is coplanar with surface 282 of lamination layer 236. Conductive layers 294a and 294b have a generally rectangular cross-section. The size and shape of conductive layers 294a and 294b can vary according to the design and function of substrate 160. In one embodiment, conductive layers 294a and 294b have a generally circular, square, or oval cross-section.

Figure 10A:
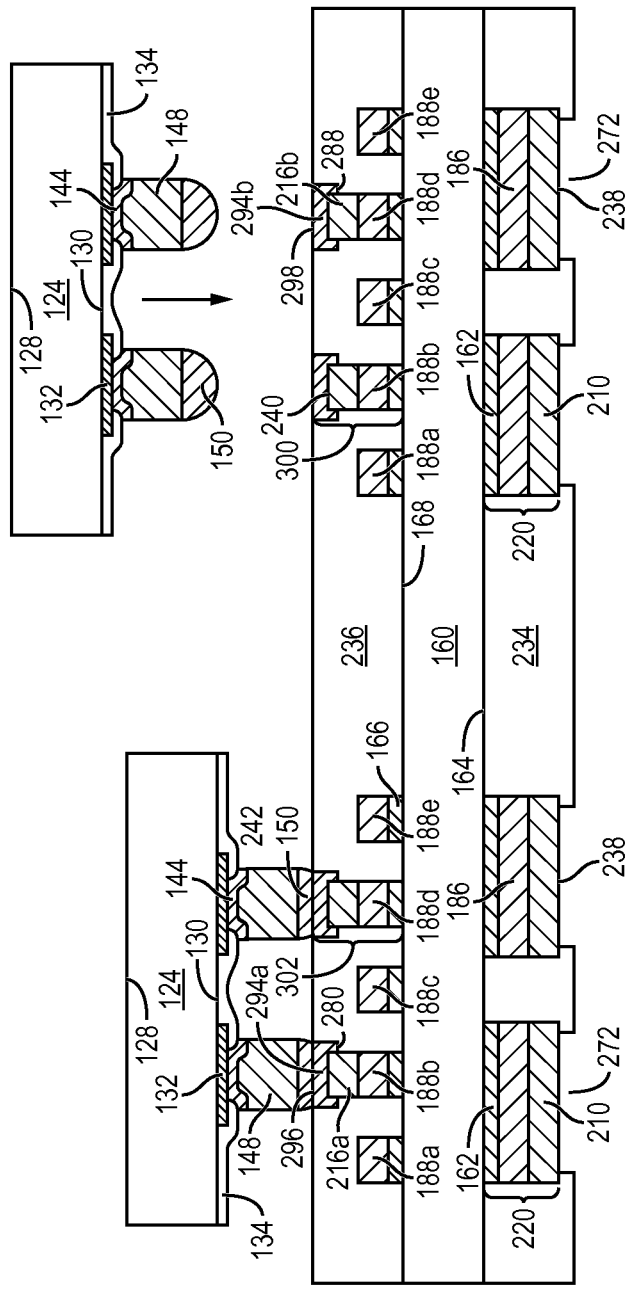
FIGS. 10a-10b illustrate a process of mounting a semiconductor die over a substrate having a duplex plated BOL pad with a wide BOL pad.
Figure 10B:
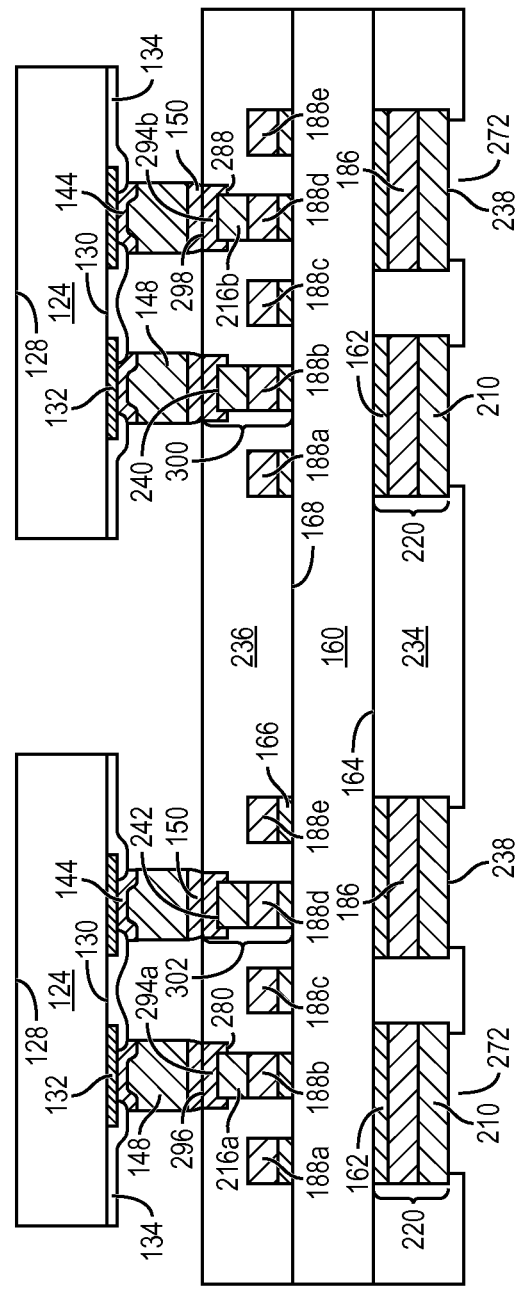

FIGS. 10a-10b illustrate, in relation to FIGS. 1 and 2a-2c, a process of mounting a semiconductor die over a substrate having wide BOL pads. In FIG. 10a, semiconductor die 124 from FIGS. 3a-3h is positioned over and mounted to substrate 160 using a pick and place operation with active surface 130 oriented toward substrate 160 and conductive pillar 148 and bump cap 150 aligned with BOL pads 300 and 302. Bump caps 150 are reflowed and semiconductor die 124 is pressed onto substrate 160 to metallurgically connect conductive pillar 148 and bump cap 150 to conductive layers 294a and 294b of BOL pads 300 and 302 in a BOL configuration. Bump caps 150 can also be compression bonded or thermocompression bonded to conductive layers 294a and 294b of BOL pads 300 and 302. Compression bonding uses pressure in excess of 10 MPa (1450 psi) at temperatures below 200° C. to bond materials via solid-state diffusion. Typical materials bonded using compression bonding include In, Au, Pb, and Pb/Sn alloys. Thermocompression bonding uses elevated temperatures in conjunction with pressure to bond materials. Typical materials bonded using thermocompression bonding include Cu, Au, and Al. In one embodiment, thermocompression bonding is used to bond bump caps 150 to conductive layers 294a and 294b BOL pads 300 and 302 by applying 30 MPa of pressure at 300° C. for 2 minutes.

FIG. 10b shows semiconductor die 124 mounted to substrate 160 with conductive pillar 148 and bump cap 150 metallurgically connected to conductive layers 294a and 294b of BOL pads 300 and 302 in a BOL configuration. Conductive layers 294a and 294b of BOL pads 300 and 302 have a cross-sectional width less than the cross sectional width of conductive pillar 148 and bump cap 150 of semiconductor die 124. Conductive pillar 148 provides standoff distance between semiconductor die 124 and substrate 160.

Because lamination layer 236 maintains coverage over conductive layers 188a-188e and 166 outside the footprint of conductive layers 294a and 294b of BOL pads 300 and 302, the adjacent conductive traces including conductive layers 188a-188e are insulated. Insulating adjacent conductive layers 188a-188e reduces the risk of ion migration between conductive layers 188a-188e and reduces the risk of electrical short between adjacent conductive layers 188a-188e during reflow of bump caps 150. The reduced risk of ion migration and electrical short between conductive layers 188a-188e allows for reduced distance between adjacent conductive traces. Furthermore, a conventional semiconductor substrate requires a minimum of 15 µm of clearance between the edge of a conductive bump and an adjacent conductive trace and a minimum pitch between adjacent bumps ranging from 105-155 µm in order to avoid electrical short during bump reflow. By insulating adjacent conductive layers 188a-188e, additional clearance between conductive pillar 148 and conductive layers 188a-188e is not necessary. Thus, the pitch between adjacent bumps can be reduced allowing for higher signal routing density and reduced package size. In one embodiment, the pitch between adjacent conductive pillars 148 ranges between 90-150 µm. Furthermore, insulating adjacent conductive layers 188a-188e facilitates electrical open/short testing at the substrate level using a test pin, because lamination layer 236 reduces the likelihood of the test pin touching adjacent traces.

FIGS. 11a-11e illustrate, in relation to FIGS. 1 and 2a-2c, a process of forming an insulating layer over a substrate. Continuing from FIG. 4t, an insulating or passivation layer 310 is formed over conductive layers 162, 186, and 210 and surface 164 of substrate 160 using PVD, CVD, printing, spin coating, spray coating, liquid coating, screen printing, or dry film lamination. Insulating layer 310 contains one or more layers of photosensitive polymer dielectric film with or without fillers, non-photosensitive polymer dielectric film, SiO2, Si3N4, SiON, Ta2O5, Al2O3, or other material having similar insulating and structural properties.

An insulating or passivation layer 312 is formed over conductive layers 166, 188, and 216 and surface 168 of substrate 160 using PVD, CVD, printing, spin coating, spray coating, liquid coating, screen printing, or dry film lamination. Insulating layer 312 contains one or more layers of photosensitive polymer dielectric film with or without fillers, non-photosensitive polymer dielectric film, SiO2, Si3N4, SiON, Ta2O5, Al2O3, or other material having similar insulating and structural properties.

Figure 11A:
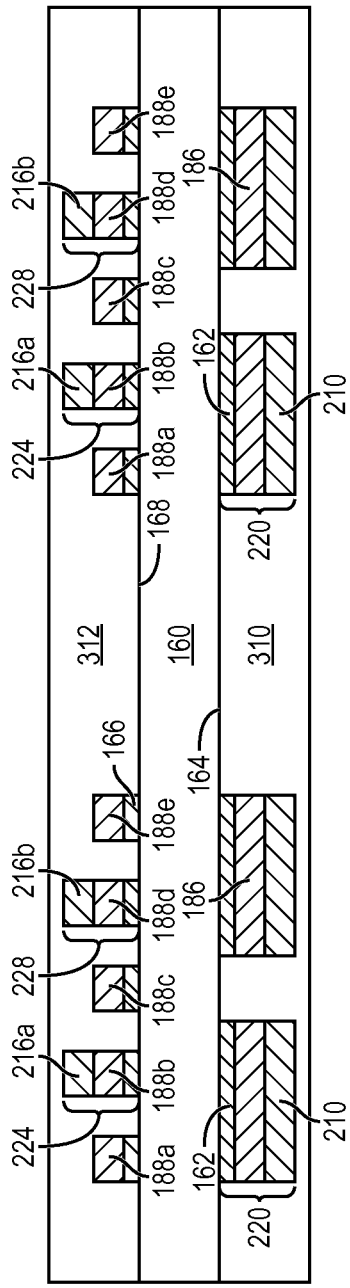
FIGS. 11a-11e illustrate a process of forming an insulating layer over a substrate.
Figure 11B:
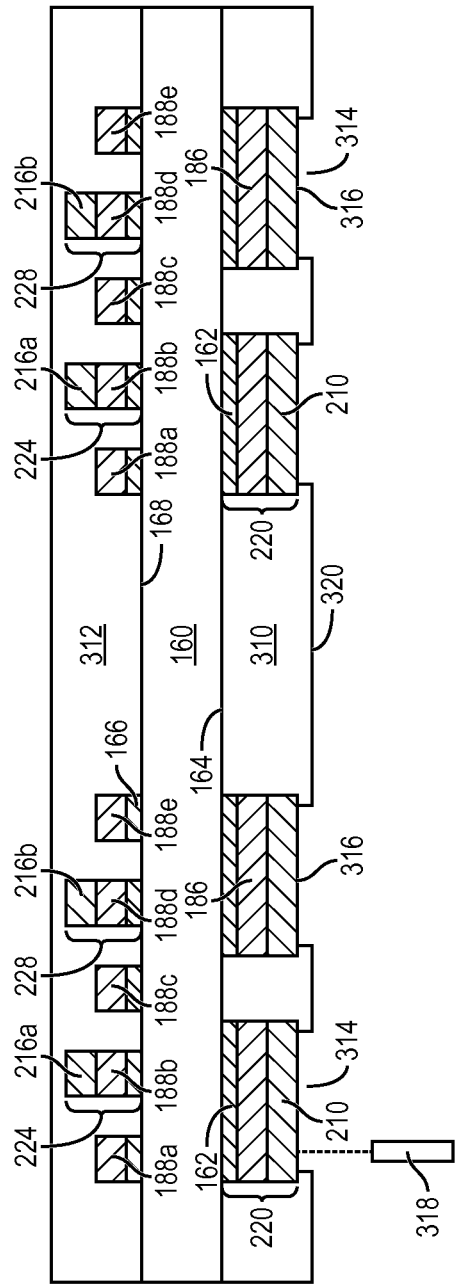

In FIG. 11b, a portion of insulating layer 310 is removed by an etching process with a patterned photoresist layer to create opening 314 and to expose a surface 316 of conductive layer 210. Alternatively, a portion of insulating layer 312 is removed by LDA using laser 318 to create opening 314 and to expose surface 316 of conductive layer 210. Opening 314 has a cross-sectional width less than the cross-sectional width of conductive layer 210. Thus, opening 314 lies within a footprint of conductive layer 210 and insulating layer 310 maintains coverage over a perimeter of conductive layer 210. Surface 316 of conductive layer 210 is vertically offset with respect to surface 320 of insulating layer 310. Thus, surface 316 of conductive layer 210 is recessed within insulating layer 310. Insulating layer 310 maintains coverage over conductive layers 162, and 186 outside a footprint of conductive layer 210.

Figure 11C:
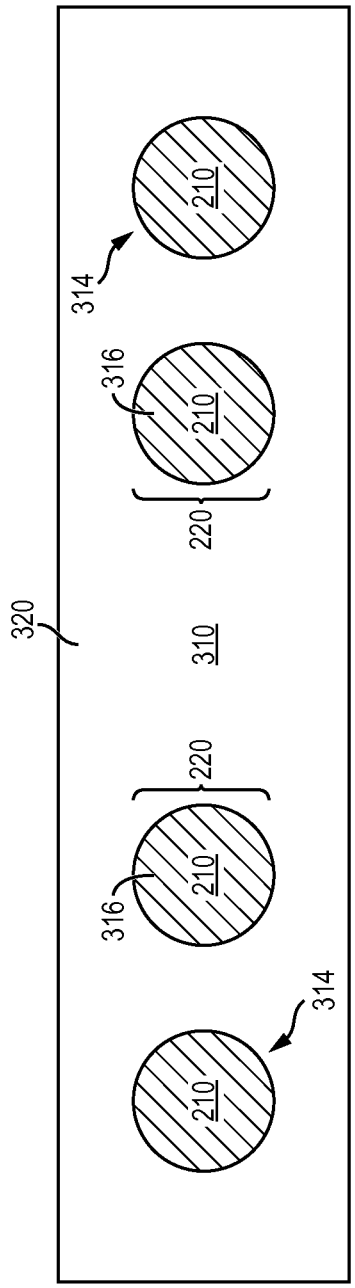

FIG. 11c shows a top or plan view of opening 314. Opening 314 has a generally circular cross-section or footprint. The shape of opening 314 can vary according to the design and function of substrate 160 and can have a generally oval, rectangular, or square cross-section or footprint. Insulating layer 310 maintains coverage over conductive layers 162 and 186 outside the footprint of conductive layer 210.

Figure 11D:
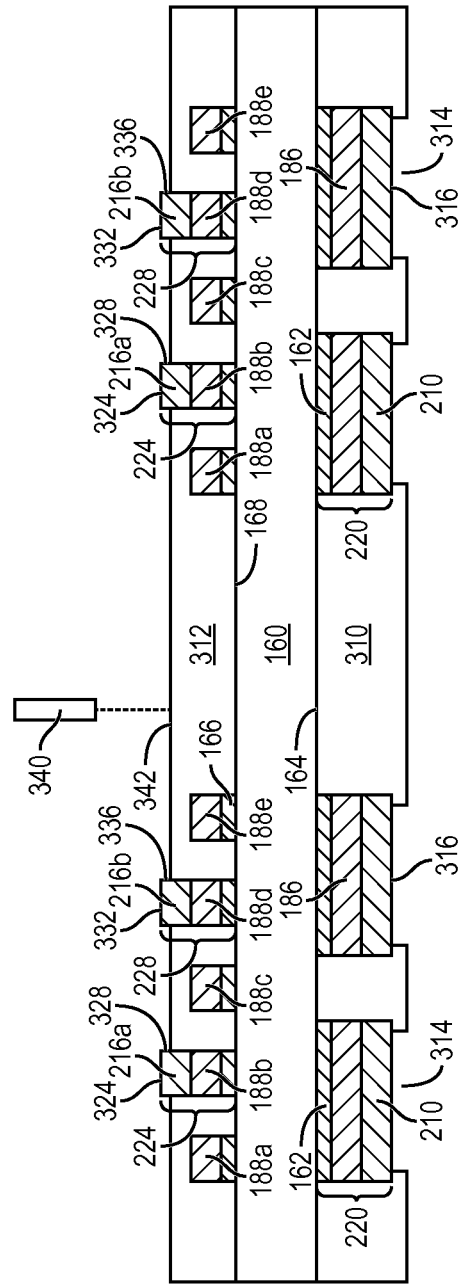

In FIG. 11d, a portion of insulating layer 312 is removed by an etching process with a patterned photoresist layer to expose surface 324 of BOL pad 224 and a portion of sidewall 328 of BOL pad 224. The etching process also removes a portion of insulating layer 312 to expose surface 332 of BOL pad 228 and a portion of sidewall 336 of BOL pad 228. Alternatively, a portion of insulating layer 312 is removed by LDA using laser 340 to expose surface 324 and a portion of sidewall 328 of BOL pad 224 and to expose surface 332 and a portion of sidewall 336 of BOL pad 228. Insulating layer 312 maintains coverage over conductive layers 166 and 188. Surface 324 of BOL pad 224 and surface 332 of BOL pad 228 are vertically offset with respect to exposed surface 342 of insulating layer 312, such that a portion of BOL pad 224 and a portion of BOL pad 228 protrude or extend outside of insulating layer 312.

Figure 11E:
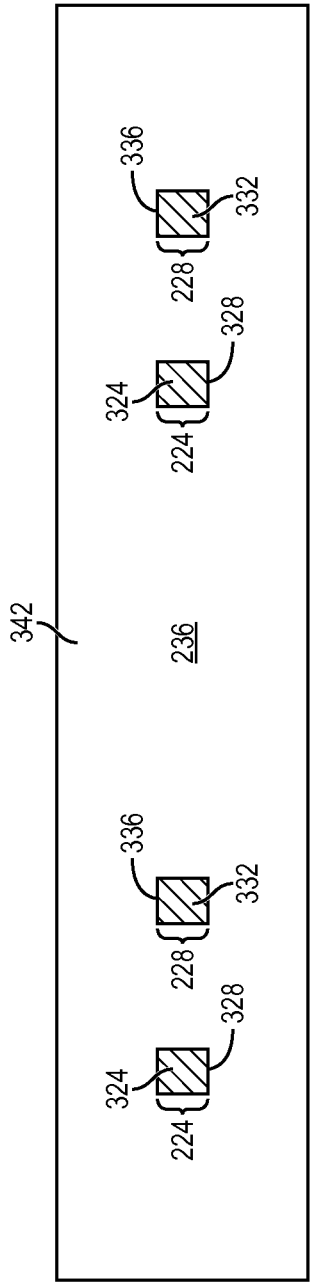

FIG. 11e shows a top or plan view of BOL pads 224 and 228. Surface 324 of BOL pad 224 is exposed through insulating layer 312 and is vertically offset from exposed surface 342 of insulating layer 312. Similarly, surface 332 of BOL pad 228 is exposed through insulating layer 312 and is vertically offset from exposed surface 342 of insulating layer 312. Thus, a portion of sidewall 328 of BOL pad 224 extends outside or is exposed above lamination layer 312. Similarly, a portion of sidewall 336 of BOL pad 228 extends outside or is exposed above lamination layer 312. BOL pads 224 and 228 have a generally rectangular cross section. The shape and size of BOL pads 224 and 228 can vary according to the design and function of semiconductor die 124. In one embodiment, BOL pads 224 and 228 have a generally square, circular, or oval shape or cross-section. Insulating layer 312 maintains coverage over conductive layers 188a-188e and conductive layer 166 outside a footprint of BOL pads 224 and 228.

Figure 12A:
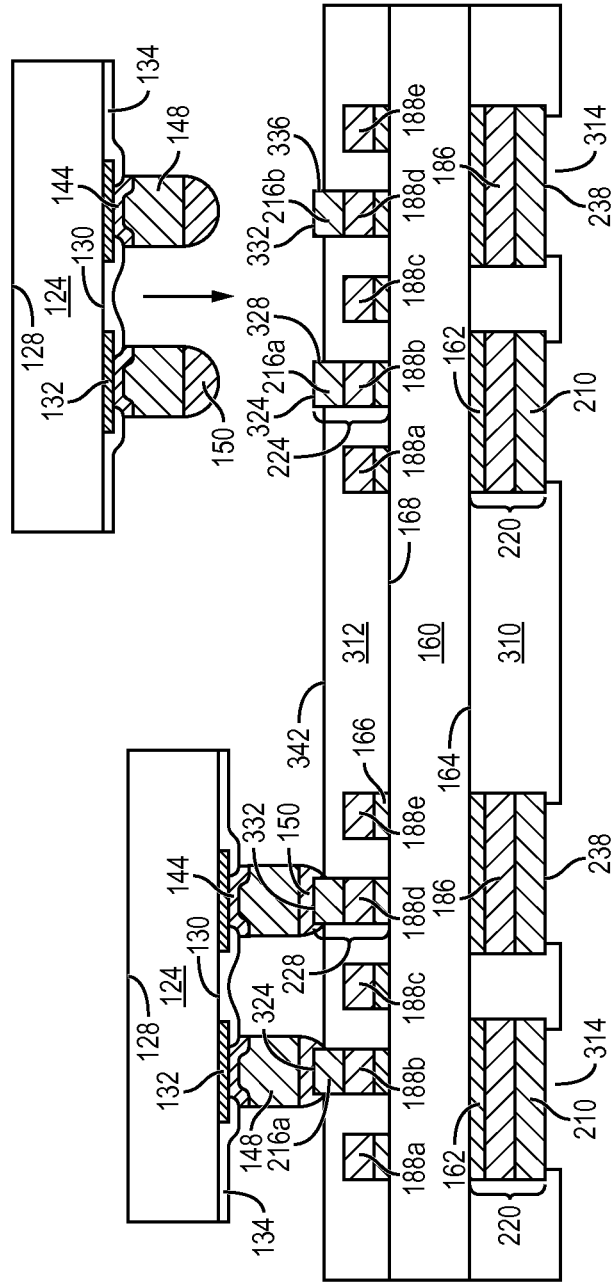
FIGS. 12a-12b illustrate a process of mounting a semiconductor die over a substrate having an insulating layer.
Figure 12B:
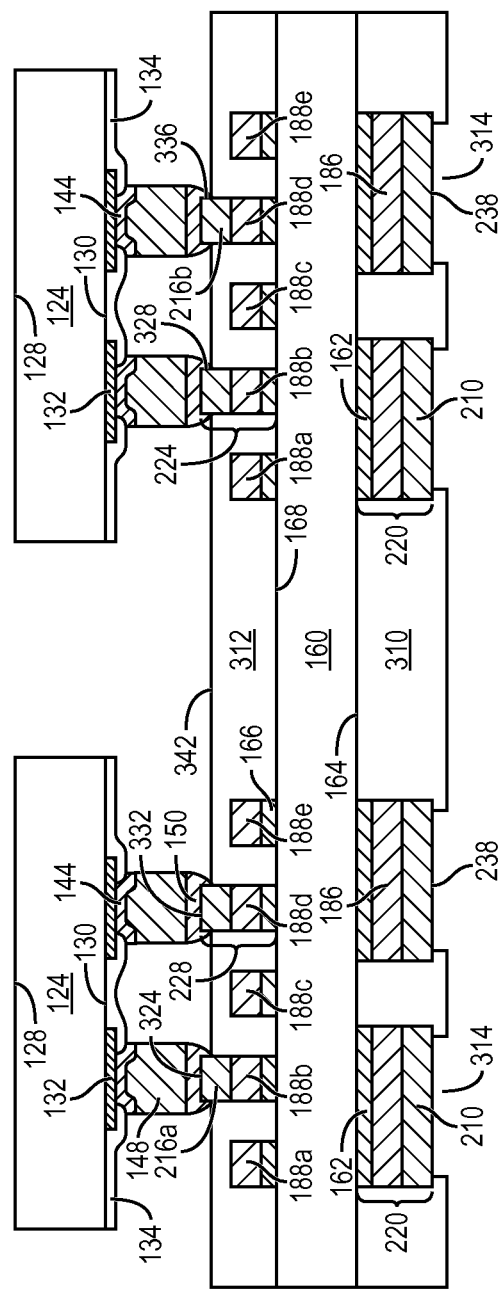

FIGS. 12a-12b illustrate, in relation to FIGS. 1 and 2a-2c, a process of mounting a semiconductor die over a substrate having an insulating layer. In FIG. 12a, semiconductor die 124 from FIGS. 3a-3h is positioned over and mounted to substrate 160 using a pick and place operation with active surface 130 oriented toward substrate 160 and conductive pillar 148 and bump cap 150 aligned with BOL pads 224 and 228. Bump caps 150 are reflowed and semiconductor die 124 is pressed onto substrate 160 to metallurgically connect conductive pillar 148 and bump cap 150 to BOL pads 224 and 228 in a BOL configuration. Bump caps 150 can also be compression bonded or thermocompression bonded to BOL pads 224 and 228. Compression bonding uses pressure in excess of 10 MPa (1450 psi) at temperatures below 200° C. to bond materials via solid-state diffusion. Typical materials bonded using compression bonding include In, Au, Pb, and Pb/Sn alloys. Thermocompression bonding uses elevated temperatures in conjunction with pressure to bond materials. Typical materials bonded using thermocompression bonding include Cu, Au, and Al. In one embodiment, thermocompression bonding is used to bond bump caps 150 to BOL pads 224 and 228 by applying 30 MPa of pressure at 300° C. for 2 minutes.

FIG. 12b shows semiconductor die 124 mounted to substrate 160 with conductive pillar 148 and bump cap 150 metallurgically connected to BOL pads 224 and 228 in a BOL configuration. BOL pads 224 and 228 have a cross-sectional width less than the cross sectional width of conductive pillar 148 and bump cap 150 of semiconductor die 124. Thus, after mounting semiconductor die 124 over substrate 160, bump cap 150 covers the exposed portion of sidewall 328 of BOL pad 224 and bump cap 150 covers the exposed portion of sidewall 336 of BOL pad 228. Conductive pillar 148 provides standoff distance between semiconductor die 124 and substrate 160.

Because insulating layer 312 maintains coverage over conductive layers 188a-188e and 166 outside the footprint of BOL pads 224 and 228, the adjacent conductive traces including conductive layers 188a-188e are insulated. Insulating adjacent conductive layers 188a-188e reduces the risk of ion migration between conductive layers 188a-188e and reduces the risk of electrical short between adjacent conductive layers 188a-188e during reflow of bump caps 150. The reduced risk of ion migration and electrical short between conductive layers 188a-188e allows for reduced distance between adjacent conductive traces. Furthermore, a conventional semiconductor substrate requires a minimum of 15 μm of clearance between the edge of a conductive bump and an adjacent conductive trace and a minimum pitch between adjacent bumps ranging from 105-155 μm in order to avoid electrical short during bump reflow. By insulating adjacent conductive layers 188a-188e, additional clearance between conductive pillar 148 and conductive layers 188a-188e is not necessary. Thus, the pitch between adjacent bumps can be reduced allowing for higher signal routing density and reduced package size. In one embodiment, the pitch between adjacent conductive pillars 148 ranges between 90-150 μm. Furthermore, insulating adjacent conductive layers 188a-188e facilitates electrical open/short testing at the substrate level using a test pin, because insulating layer 312 reduces the likelihood of the test pin touching adjacent traces.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    forming a first patterning layer over the substrate;
    forming a plurality of conductive segments over the substrate within a plurality of openings of the first patterning layer;
    forming a second patterning layer over the first patterning layer and conductive segments;
    forming a first conductive layer within an opening of the second patterning layer, wherein the opening of the second patterning layer is aligned with one of the openings in the first patterning layer and the first conductive layer includes a cross-sectional width equal to a cross-sectional width of a first one of the conductive segments and in contact with the first one of the conductive segments and vertically offset from a second one of the conductive segments; and
    forming an insulating layer over the substrate, first conductive layer, and conductive segments after forming the first conductive layer, wherein the insulating layer is disposed between the first one of the conductive segments and the second one of the conductive segments and contacts a surface of the second one of the conductive segments opposite the substrate.

2. The method of claim 1, further including removing a portion of the insulating layer to expose the first conductive layer.

3. The method of claim 1, further including removing a portion of the insulating layer by a laser direct ablation.

4. The method of claim 1, wherein forming the insulating layer over the substrate includes pressing the insulating layer over the first conductive layer and conductive segments.

5. The method of claim 1, further including forming a contact pad over a surface of the substrate opposite the first conductive layer.

6. The method of claim 1, further including disposing a semiconductor die over the substrate.

7. The method of claim 1, wherein forming the conductive segments includes:
    forming a second conductive layer over the substrate; and
    forming a third conductive layer over the second conductive layer.

8. A method of making a semiconductor device, comprising:
    providing a substrate;
    forming a first conductive layer over the substrate;
    forming a second conductive layer having a cross-sectional width equal to a cross-sectional width of a first portion of the first conductive layer, wherein the second conductive layer is disposed over the first portion of the first conductive layer and vertically offset from a second portion of the first conductive layer;
    forming an insulating layer over the substrate, first conductive layer, and second conductive layer after forming the second conductive layer, wherein the insulating layer is disposed between the first portion of the first conductive layer and the second portion of the first conductive layer and contacts a surface of the second portion of the first conductive layer opposite the substrate; and
    disposing an interconnect structure over the second conductive layer, wherein the interconnect structure extends to a surface of the insulating layer recessed below a surface of the second conductive layer.

9. The method of claim 8, further including removing a portion of the insulating layer from over the second conductive layer.

10. The method of claim 8, wherein forming the insulating layer includes disposing the insulating layer over the first conductive layer and pressing the insulating layer toward the substrate.

* * * * *